(12) United States Patent
Yuan et al.

(10) Patent No.: US 11,437,440 B2
(45) Date of Patent: Sep. 6, 2022

(54) ARRAY SUBSTRATE HAVING DETECTION AND COMPENSATION LEAD LINES, DISPLAY APPARATUS, METHOD OF FABRICATING ARRAY SUBSTRATE, AND PIXEL DRIVING CIRCUIT HAVING CONNECTION BRIDGE

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Pan Xu, Beijing (CN); Zhidong Yuan, Beijing (CN); Meng Li, Beijing (CN); Xuehuan Feng, Beijing (CN); Zehua Ding, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 149 days.

(21) Appl. No.: 16/963,346

(22) PCT Filed: Sep. 27, 2019

(86) PCT No.: PCT/CN2019/108573
§ 371 (c)(1),
(2) Date: Jul. 20, 2020

(87) PCT Pub. No.: WO2021/056422
PCT Pub. Date: Apr. 1, 2021

(65) Prior Publication Data
US 2021/0408160 A1    Dec. 30, 2021

Related U.S. Application Data

(63) Continuation-in-part of application No. PCT/CN2019/094867, filed on Jul. 5, 2019.

(51) Int. Cl.
*H01L 29/08* (2006.01)
*H01L 27/32* (2006.01)
*G09G 3/3225* (2016.01)

(52) U.S. Cl.
CPC ....... *H01L 27/3218* (2013.01); *G09G 3/3225* (2013.01); *H01L 27/3213* (2013.01);
(Continued)

(58) Field of Classification Search
CPC ............. H01L 27/3218; H01L 27/3213; H01L 27/3262; H01L 27/3265; G09G 3/3225
(Continued)

(56) References Cited

U.S. PATENT DOCUMENTS

2015/0097172 A1* 4/2015 Han ................ G02F 1/136213
257/40
2017/0125506 A1* 5/2017 Kim .................... H01L 27/3265

* cited by examiner

*Primary Examiner* — Phuc T Dang
(74) *Attorney, Agent, or Firm* — Intellectual Valley Law, P.C.

(57) ABSTRACT

An array substrate includes an array of a plurality of subpixels including a plurality of columns of subpixels respectively spaced apart by a plurality of inter-subpixel regions; a plurality of pixel driving circuits respectively driving light emission of the plurality of subpixels; and a plurality of detection and compensation lead lines respectively configured to respectively detect signals in the plurality of subpixels and respectively compensate signals in the plurality of subpixels. A respective one of a plurality of detection and compensation lead lines is disposed in a first inter-subpixel region between two directly adjacent columns of subpixels. The respective one of the plurality of detection and compensation lead lines is spaced apart by at least one columns of subpixels from a signal line configured to
(Continued)

transmit an alternating current and arranged along a direction parallel to the respective one of the plurality of detection and compensation lead lines.

19 Claims, 10 Drawing Sheets

(52) U.S. Cl.
CPC ...... *H01L 27/3262* (2013.01); *H01L 27/3265* (2013.01); *H01L 27/3272* (2013.01); *H01L 27/3276* (2013.01); *H01L 2227/323* (2013.01)

(58) Field of Classification Search
USPC .......................................................... 257/40
See application file for complete search history.

ARRAY SUBSTRATE HAVING DETECTION AND COMPENSATION LEAD LINES, DISPLAY APPARATUS, METHOD OF FABRICATING ARRAY SUBSTRATE, AND PIXEL DRIVING CIRCUIT HAVING CONNECTION BRIDGE

CROSS-REFERENCE TO RELATED APPLICATION

This application is a national stage application under 35 U.S.C. § 371 of International Application No. PCT/CN2019/108573, filed Sep. 27, 2019, which is a continuation-in-part of International Application No. PCT/CN2019/094867, filed Jul. 5, 2019. Each of the forgoing applications is herein incorporated by reference in its entirety for all purposes.

TECHNICAL FIELD

The present invention relates to display technology, more particularly, to an array substrate, a display apparatus, a method of fabricating an array substrate, and a pixel driving circuit.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. In the top-emission type OLED, the cathode is optically transparent, while the anode is reflective.

SUMMARY

In one aspect, the present invention provides an array substrate comprising an array of a plurality of subpixel comprising a plurality of columns of subpixels respectively spaced apart by a plurality of inter-subpixel regions; a plurality of pixel driving circuits respectively driving light emission of the plurality of subpixels; and a plurality of detection and compensation lead lines respectively configured to respectively detect signals in the plurality of subpixels and respectively compensate signals in the plurality of subpixels; wherein one of a plurality of detection and compensation lead lines electrically connects a respective one of the plurality of pixel driving circuits to a data detection and compensation circuit; a respective one of the plurality of detection and compensation lead lines is disposed in a first inter-subpixel region between two directly adjacent columns of subpixels; and the respective one of the plurality of detection and compensation lead lines is spaced apart by at least one columns of subpixels from a signal line configured to transmit an alternating current and arranged along a direction parallel to the respective one of the plurality of detection and compensation lead lines.

Optionally, the array substrate further comprises a plurality of data lines configured to respectively transmit data signals to the plurality of subpixels; wherein the plurality of data lines and the plurality of detection and compensation lead lines are arranged along a substantially same direction; and the respective one of the plurality of detection and compensation lead lines is spaced apart by at least one columns of subpixels from any data line.

Optionally, in at least a second inter-subpixel region of the plurality of inter-subpixel regions, two data lines of the plurality of data lines are in a same inter-subpixel region between two directly adjacent columns of subpixels.

Optionally, the array substrate further comprises a plurality of low voltage signal lines configured to provide a low voltage signal to a cathode of a light emitting element in a respective one of the plurality of subpixels; wherein the plurality of low voltage signal lines and the plurality of detection and compensation lead lines are arranged along a substantially same direction; and a respective one of the plurality of low voltage signal lines and the respective one of the plurality of detection and compensation lead lines are in a same inter-subpixel region between two directly adjacent columns of subpixels.

Optionally, the array substrate further comprises a plurality of power supply lines configured to provide a high voltage signal to a respective one of the plurality of pixel driving circuit; wherein the plurality of power supply lines and the plurality of detection and compensation lead lines are arranged along a substantially same direction; a respective one of the plurality of power supply lines is disposed in a third inter-subpixel region between two directly adjacent columns of subpixels; and the third inter-subpixel region is spaced apart from the first inter-subpixel region by at least one columns of subpixels.

Optionally, N columns of the plurality of columns of subpixels. N number of data lines of a plurality of data lines, the respective one of the plurality of detection and compensation lead lines, and a respective one of a plurality of low voltage signal lines are disposed between two most adjacent power supply lines of the plurality of power supply lines, N>2.

Optionally, the respective one of the plurality of detection and compensation lead lines and the respective one of a plurality of low voltage signal lines are disposed in a central-most inter-subpixel region between two adjacent central-most columns of the N columns of the plurality of columns of subpixels; and in at least a second inter-subpixel region of the plurality of inter-subpixel regions, two data lines of the plurality of data lines are in a same inter-subpixel region between two directly adjacent columns of subpixels.

Optionally, the array substrate further comprises a plurality of detection and compensation lines electrically connected to the plurality of detection and compensation lead lines; wherein a respective one of the plurality of detection and compensation lines electrically connects pixel driving circuits in a respective row of subpixels to a data detection and compensation circuit; and a respective one of the plurality of detection and compensation lines is disposed in an inter-subpixel region between two directly adjacent rows of subpixels.

Optionally, a respective one of the plurality of pixel driving circuits comprises a storage capacitor; the storage capacitor comprises a first capacitor and a second capacitor electrically connected in parallel; the first capacitor comprises a semiconductor electrode layer, a first capacitor electrode, and an insulating layer between the semiconductor electrode layer and the first capacitor electrode; and the second capacitor comprises the semiconductor electrode layer, a second capacitor electrode, and an inter-layer dielectric layer between the semiconductor electrode layer and the second capacitor electrode; wherein the first capacitor electrode is configured to at least partially shield light irradiating on an active layer of a thin film transistor in the respective one of the plurality of pixel driving circuits; an orthographic projection of the first capacitor electrode on a base substrate at least partially overlapping with an orthographic projection of the active layer of the thin film transistor in the respective one of the plurality of pixel driving circuits on the base substrate; and the second capacitor electrode is in a same layer as a source electrode of the thin film transistor in the respective one of the plurality of pixel driving circuits.

Optionally, the respective one of the plurality of pixel driving circuits further comprises a driving thin film transistor and a switching thin film transistor; a source electrode of the switching thin film transistor is connected to a respective one of a plurality of data lines; a drain electrode of the switching thin film transistor is connected to the semiconductor electrode layer; a gate electrode of the switching thin film transistor is connected to a respective one of a plurality of first gate lines; a source electrode of the driving thin film transistor is connected to a respective one of a plurality of power supply lines; a drain electrode of the driving thin film transistor is connected to a light emitting element in a respective one of the plurality of subpixels; and a gate electrode of the driving thin film transistor is connected to a drain electrode of the switching thin film transistor; wherein the semiconductor electrode layer and an active layer of the switching thin film transistor are parts of a unitary structure; the respective one of the plurality of pixel driving circuits comprises a connection bridge electrically connecting the semiconductor electrode layer and the active layer of the switching thin film transistor; the connection bridge is on a side of an extension portion of the gate electrode of the driving thin film transistor away from the base substrate; the connection bridge comprises a first portion in direct contact with the extension portion of the gate electrode of the driving thin film transistor, a second portion in direct contact with the semiconductor electrode layer, and a third portion in direct contact with the active layer of the switching thin film transistor; and the third portion functions as the source electrode of the switching thin film transistor.

Optionally, the connection bridge is in a same layer as the source electrode and the drain electrode of the driving thin film transistor; the connection bridge extends through the inter-layer dielectric layer respectively on two sides of the extension portion of the gate electrode of the driving thin film transistor to respectively connected to two portions of the semiconductor electrode layer; and an orthographic projection of the connection bridge on the base substrate partially overlaps with an orthographic projection of the gate electrode of the driving thin film transistor on the base substrate.

Optionally, the respective one of the plurality of pixel driving circuits further comprises a detection switch thin film transistor; a source electrode of the detection switch thin film transistor is connected to the drain electrode of the driving thin film transistor; a drain electrode of the detection switch thin film transistor is connected to the respective one of the plurality of detection and compensation lines; a gate electrode of the detection switch thin film transistor is connected to a respective one of a plurality of second gate lines; the second capacitor electrode, the source electrode of the detection switch thin film transistor, and the drain electrode of driving thin film transistor in the respective one of the plurality of pixel driving circuits are parts of a unitary structure; the array substrate further comprises a passivation layer between the second capacitor electrode and an anode of a light element in a respective one of the plurality of subpixels; and the anode of the light element in the respective one of the plurality of subpixels extends through the passivation layer to connect to the unitary structure.

Optionally, the respective one of the plurality of detection and compensation lines, a respective one of the plurality of first gate lines, and a respective one of the plurality of second gate lines are disposed in a same inter-subpixel region between two directly adjacent rows of subpixels.

Optionally, the array substrate further comprises an auxiliary cathode on a base substrate and electrically connected to a respective one of the plurality of low voltage signal lines; at least a passivation layer on a side of the auxiliary cathode away from the base substrate; wherein a cathode of a light emitting element extends through at least the passivation layer to connect to the auxiliary cathode.

In another aspect, the present invention provides a display apparatus, comprising the array substrate described herein or fabricated by a method described herein, and one or more integrated circuits connected to the array substrate.

In another aspect, the present invention provides a pixel driving circuit, comprising a storage capacitor; wherein the storage capacitor comprises a first capacitor and a second capacitor electrically connected in parallel; the first capacitor comprises a semiconductor electrode layer, a first capacitor electrode, and an insulating layer between the semiconductor electrode layer and the first capacitor electrode; and the second capacitor comprises the semiconductor electrode layer, a second capacitor electrode, and an inter-layer dielectric layer between the semiconductor electrode layer and the second capacitor electrode; wherein the first capacitor electrode is configured to at least partially shield light irradiating on an active layer of a thin film transistor in the respective one of a plurality of pixel driving circuits; an orthographic projection of the first capacitor electrode on a base substrate at least partially overlapping with an orthographic projection of the active layer of the thin film transistor in the respective one of the plurality of pixel driving circuits on the base substrate; and the second capacitor electrode is in a same layer as a source electrode of the thin film transistor in the respective one of the plurality of pixel driving circuits.

Optionally, the pixel driving circuits further comprises a driving thin film transistor and a switching thin film transistor; a source electrode of the switching thin film transistor is connected to a respective one of a plurality of data lines; a drain electrode of the switching thin film transistor is connected to the semiconductor electrode layer; a gate electrode of the switching thin film transistor is connected to a respective one of a plurality of first gate lines; a source electrode of the driving thin film transistor is connected to a respective one of a plurality of power supply lines; a drain electrode of the driving thin film transistor is connected to a light emitting element in a respective one of a plurality of subpixels; and a gate electrode of the driving thin film transistor is connected to a drain electrode of the switching thin film transistor; wherein the semiconductor electrode layer and an active layer of the switching thin film transistor are parts of a unitary structure; the respective one of the plurality of pixel driving circuits comprises a connection bridge electrically connecting the semiconductor electrode layer and the active layer of the switching thin film transistor; the connection bridge is on a side of an extension portion of the gate electrode of the driving thin film transistor away from the base substrate; the connection bridge comprises a first portion in direct contact with the extension portion of the gate electrode of the driving thin film transistor, a second portion in direct contact with the semiconductor electrode layer, and a third portion in direct contact with the active layer of the switching thin film transistor; and the third portion functions as the source electrode of the switching thin film transistor.

Optionally, the connection bridge is in a same layer as the source electrode and the drain electrode of the driving thin film transistor; the connection bridge extends through the inter-layer dielectric layer respectively on two sides of the extension portion of the gate electrode of the driving thin film transistor to respectively connected to two portions of the semiconductor electrode layer; and an orthographic projection of the connection bridge on the base substrate partially overlaps with an orthographic projection of the gate electrode of the driving thin film transistor on the base substrate.

Optionally, the pixel driving circuits further comprises a detection switch thin film transistor; a source electrode of the detection switch thin film transistor is connected to the drain electrode of the driving thin film transistor; a drain electrode of the detection switch thin film transistor is connected to the respective one of a plurality of detection and compensation lines; a gate electrode of the detection switch thin film transistor is connected to a respective one of a plurality of second gate lines; the second capacitor electrode, the source electrode of the detection switch thin film transistor, and the drain electrode of driving thin film transistor in the respective one of the plurality of pixel driving circuits are parts of a unitary structure; the pixel driving circuits further comprises a passivation layer between the second capacitor electrode and an anode of a light element in a respective one of the plurality of subpixels; and the anode of the light element in the respective one of the plurality of subpixels extends through the passivation layer to connect to the unitary structure.

In another aspect, the present invention provides a method of fabricating an array substrate, comprising forming an array of a plurality of subpixels comprising a plurality of columns of subpixels respectively spaced apart by a plurality of inter-subpixel regions; forming a plurality of pixel driving circuits respectively driving light emission of the plurality of subpixels; and forming a plurality of detection and compensation lead lines respectively configured to respectively detect signals in the plurality of subpixels and respectively compensate signals in the plurality of subpixels; wherein one of a plurality of detection and compensation lead lines electrically connects a respective one of the plurality of pixel driving circuits to a data detection and compensation circuit; a respective one of the plurality of detection and compensation lead lines is disposed in a first inter-subpixel region between two directly adjacent columns of subpixels; and the respective one of the plurality of detection and compensation lead lines is spaced apart by at least one columns of subpixels from a signal line configured to transmit an alternating current and arranged along a direction parallel to the respective one of the plurality of detection and compensation lead lines.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
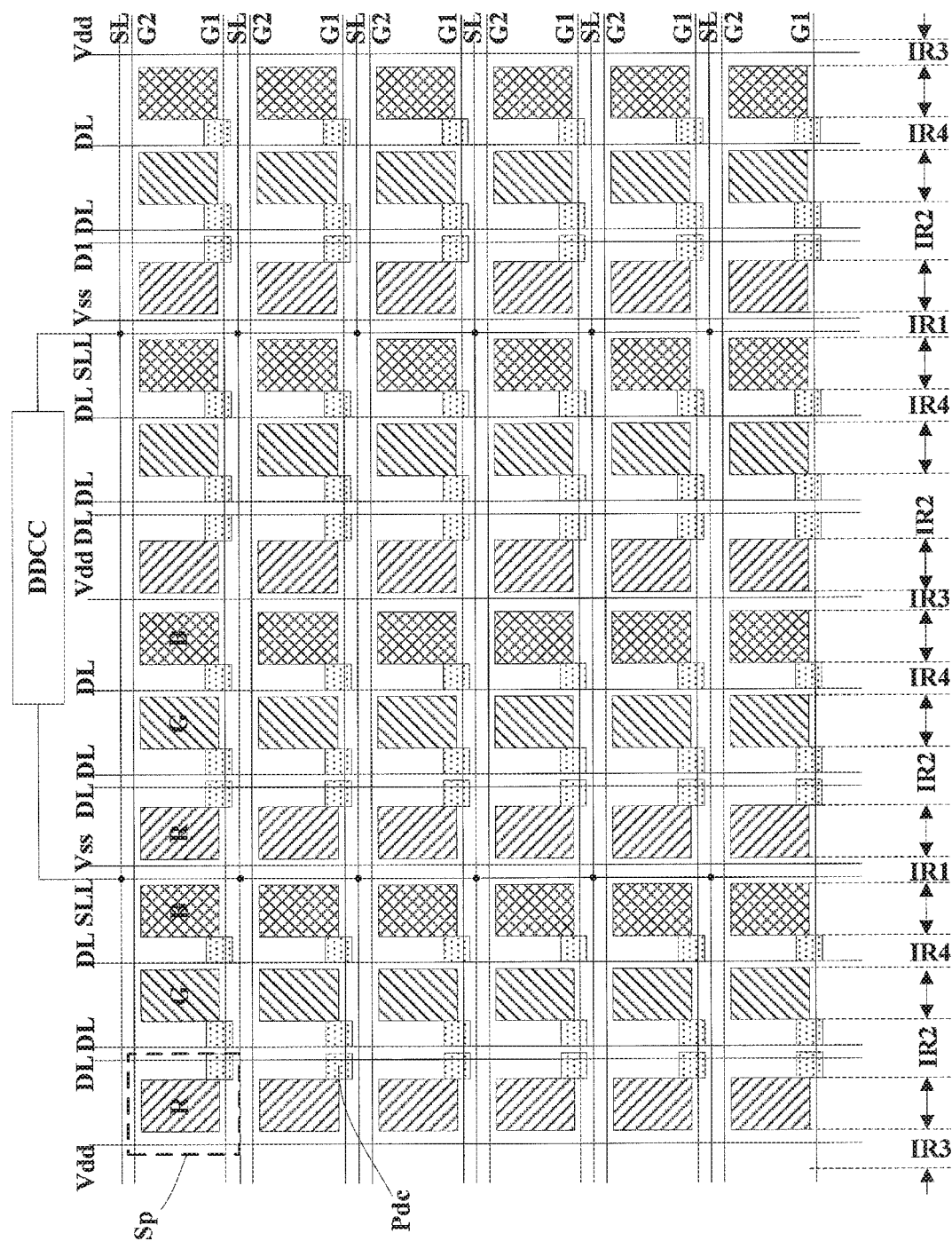
FIG. 1 is a schematic diagram illustrating the structure of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a self-emitting display apparatus, a cathode of a light emitting element is provided with a low voltage signal, e.g., a Vss signal. In related display apparatus, the Vss signal is provided directly to the cathode by a signal line in a peripheral region of the display apparatus. Thus, an IR drop exists across different regions of the cathode across the display panel. The IR drop leads to non-uniformity of voltage levels across various regions of the cathode, resulting in non-uniformity of display illuminance in the display panel.

Accordingly, the present disclosure provides, inter alia, an array substrate, a display apparatus, a method of fabricating an array substrate, and a pixel driving circuit that substantially obviate one or more of the problems due to limitations and disadvantages of the related art. In one aspect, the present disclosure provides an array substrate. In some embodiments, the array substrate includes an array of a plurality of subpixels including a plurality of columns of subpixels respectively spaced apart by a plurality of inter-subpixel regions; a plurality of pixel driving circuits respectively driving light emission of the plurality of subpixels; and a plurality of detection and compensation lead lines respectively configured to respectively detect signals in the plurality of subpixels and respectively compensate signals in the plurality of subpixels. Optionally, one of a plurality of detection and compensation lead lines electrically connects a respective one of the plurality of pixel driving circuits to a data detection and compensation circuit. Optionally, a respective one of the plurality of detection and compensation lead lines is disposed in a first inter-subpixel region between two directly adjacent columns of subpixels. Optionally, the respective one of the plurality of detection and compensation lead lines is spaced apart by at least one columns of subpixels from a signal line configured to transmit an alternating current and arranged along a direction parallel to the respective one of the plurality of detection and compensation lead lines.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1 is a schematic diagram illustrating the structure of an array substrate in some embodiments according to the present disclosure. Referring to FIG. 1, the array substrate in some embodiments includes an array of a plurality of subpixels, for example, arranged in a plurality of columns and a plurality of rows. The plurality of columns of subpixels are respectively spaced apart by a plurality of inter-subpixel regions, e.g., an inter-subpixel region IR1, an inter-subpixel region IR2, an inter-subpixel region IR3, and an inter-subpixel region IR4 as shown in FIG. 1. The array substrate further includes a plurality of light emitting elements respectively in the plurality of subpixels. As shown in FIG. 1, the plurality of light emitting elements includes a plurality of red light emitting elements R, a plurality of green light emitting elements G, and a plurality of blue light emitting elements B.

Various appropriate light emitting elements may be used in the present array substrate. Examples of appropriate light emitting elements include organic light emitting diodes, quantum dots light emitting diodes, and micro light emitting diodes. Optionally, the light emitting element is an organic light emitting diode including an organic light emitting layer. Various appropriate materials and various appropriate fabricating methods may be used to make the organic light emitting layer. For example, an organic light emitting material may be deposited by a plasma-enhanced chemical vapor deposition (PECVD) process or a coating process. Optionally, the organic light emitting layer may have a single layer structure. Optionally, the organic light emitting layer has a multi-layer structure and including multiple sub-layers.

Referring to FIG. 1, the array substrate in some embodiments further includes a plurality of pixel driving circuits Pdc respectively driving light emission of the plurality of subpixels Sp; and a plurality of detection and compensation lead lines SLL respectively configured to respectively detect signals in the plurality of subpixels Sp and respectively compensate signals in the plurality of subpixels Sp. For example, one of a plurality of detection and compensation lead lines SLL electrically connects a respective one of the plurality of pixel driving circuits Pdc to a data detection and compensation circuit DDCC. The plurality of detection and compensation lead lines SLL transmits the signals respectively detected in the plurality of subpixels Sp to the data detection and compensation circuit DDCC, and the data detection and compensation circuit DDCC compensate data signals of the plurality of subpixels Sp based on the signals respectively detected in the plurality of subpixels Sp accordingly. In some embodiments, a respective one of the plurality of detection and compensation lead lines SLL is disposed in a first inter-subpixel region IR1 between two directly adjacent columns of subpixels. The respective one of the plurality of detection and compensation lead lines SLL is spaced apart by at least one columns of subpixels from a signal line configured to transmit an alternating current and arranged along a direction parallel to the respective one of the plurality of detection and compensation lead lines SLL. For example, the respective one of the plurality of detection and compensation lead lines SLL is not in a same inter-subpixel region with any signal line configured to transmit an alternating current. Optionally, the respective one of the plurality of detection and compensation lead lines SLL is the only signal line extending through that inter-subpixel region. Examples of signal lines configured to transmit an alternating current includes data lines, gate lines, various clock signal lines, touch scanning signal lines, and so on.

Referring to FIG. 1, in some embodiments, the array substrate further includes a plurality of data lines DL configured to respectively transmit data signals to the plurality of subpixels. In one example, the plurality of data lines DL and the plurality of detection and compensation lead lines SLL are arranged along a substantially same direction (e.g., the column direction in FIG. 1). Optionally, the respective one of the plurality of detection and compensation lead lines SLL is spaced apart by at least one columns of subpixels from any data line. As shown in FIG. 1, the respective one of the plurality of detection and compensation lead lines SLL is spaced apart by a column of subpixel from a most-adjacent data line of the plurality of data lines DL.

In some embodiments, in at least a second inter-subpixel region IR2 of the plurality of inter-subpixel regions, two data lines of the plurality of data lines DL are in a same inter-subpixel region between two directly adjacent columns of subpixels. For example, as shown in FIG. 1, in the second inter-subpixel region IR2, two data lines of the plurality of data lines DL are in a same inter-subpixel region between a column of red subpixels and a column of green subpixels. The two data lines of the plurality of data lines DL are configured to respectively transmit data signals to the column of red subpixels and the column of green subpixels.

In some embodiments, in at least a fourth inter-subpixel region IR4 of the plurality of inter-subpixel regions, only a single data line of the plurality of data lines DL is in a same inter-subpixel region between two directly adjacent columns of subpixels. For example, as shown in FIG. 1, in the fourth inter-subpixel region IR4, a single data line of the plurality of data lines DL is in a same inter-subpixel region between a column of blue subpixels and a column of green subpixels. The single data line of the plurality of data lines DL is configured to respectively transmit data signals to the column of blue subpixels.

Referring to FIG. 1, in some embodiments, the array substrate further includes a plurality of low voltage signal lines Vss configured to provide a low voltage signal to a cathode of a light emitting element in a respective one of the plurality of subpixels Sp. In one example, the plurality of low voltage signal lines Vss and the plurality of detection and compensation lead lines SLL are arranged along a substantially same direction (e.g., the column direction in FIG. 1). Optionally, a respective one of the plurality of low voltage signal lines Vss and the respective one of the plurality of detection and compensation lead lines SLL are in a same inter-subpixel region between two directly adjacent columns of subpixels Sp. As shown in FIG. 1, the respective one of the plurality of low voltage signal lines Vss and the respective one of the plurality of detection and compensation lead lines SLL are in the first inter-subpixel region IR1 between a column of blue subpixel and a column of red subpixels.

In the present array substrate, the respective one of the plurality of detection and compensation lead lines SLL is not in a same inter-subpixel region as a signal line configured to transmit an alternating current, interference on the data signals transmitted in the respective one of the plurality of detection and compensation lead lines SLL by the signal line configured to transmit an alternating current can be obviated. For example, this can be achieved by spacing the respective one of the plurality of detection and compensation lead lines SLL from the signal line configured to transmit an alternating current such as a data line by at least one columns of subpixels. Optionally, for consideration of efficient circuit layout, a signal line configured to transmit a direct current (e.g., a respective one of the low voltage signal lines Vss) may be disposed in a same inter-subpixel region as the respective one of the plurality of detection and compensation lead lines SLL.

In some embodiments, the array substrate further includes a plurality of power supply lines Vdd configured to provide a high voltage signal to a respective one of the plurality of pixel driving circuit Pdc. In one example, the plurality of power supply lines Vdd and the plurality of detection and compensation lead lines SLL are arranged along a substantially same direction (e.g., the column direction in FIG. 1). In some embodiments, a respective one of the plurality of power supply lines Vdd is disposed in a third inter-subpixel region IR3 between two directly adjacent columns of subpixels. In one example, the respective one of the plurality of power supply lines Vdd is the only signal line extending through the third inter-subpixel region IR3, as shown in FIG. 1. Optionally, the third inter-subpixel region IR3 is spaced apart from the first subpixel region IR1 by at least one columns of subpixels. As shown in FIG. 1, the third inter-subpixel region IR3 is spaced apart from the first inter-subpixel region IR1 by three columns of subpixels, including a column of red subpixels, a column of green subpixels, and a column of blue subpixels.

Figure 2:
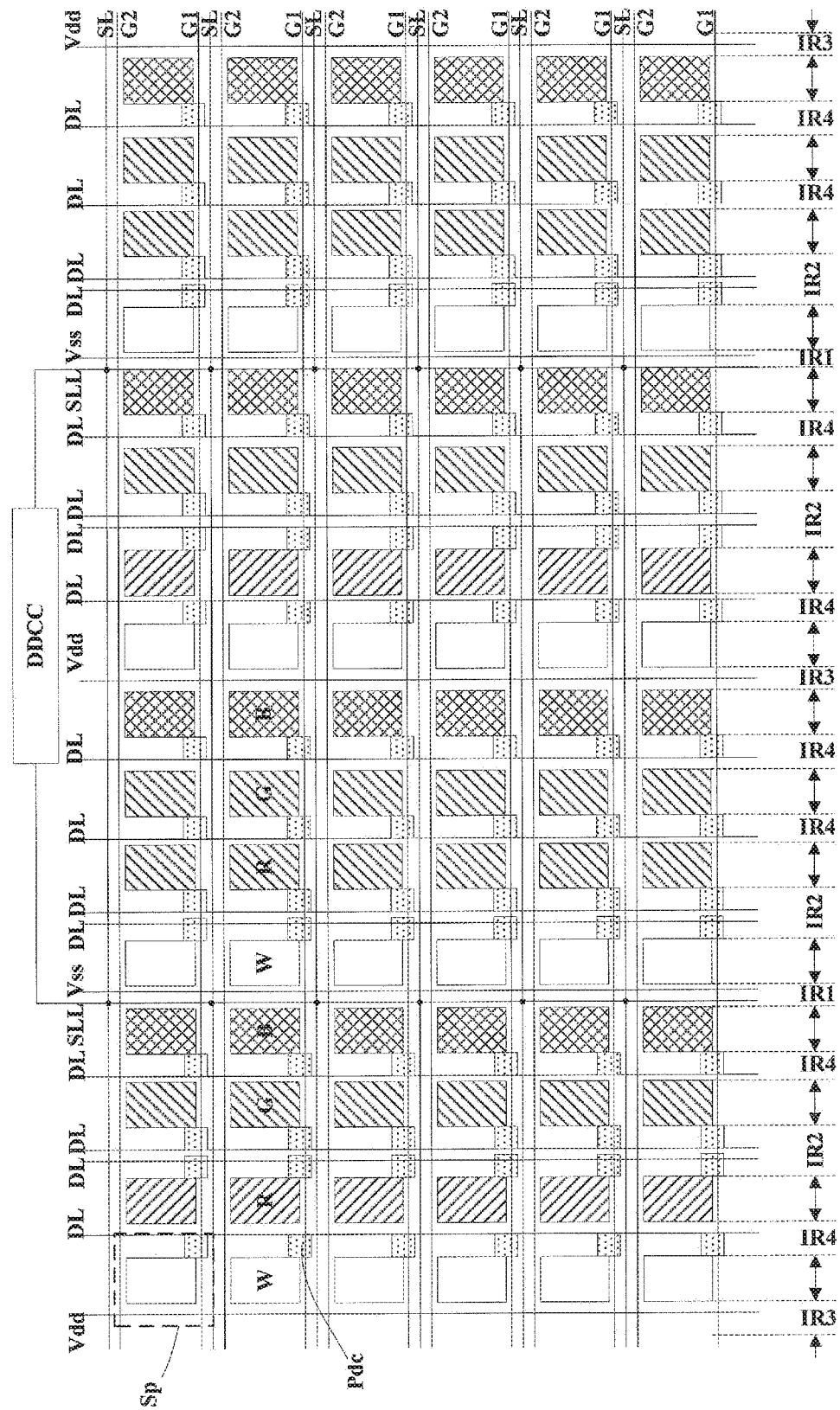
FIG. 2 is a schematic diagram illustrating the structure of an array substrate in some embodiments according to the present disclosure.

FIG. 2 is a schematic diagram illustrating the structure of an array substrate in some embodiments according to the present disclosure. Referring to FIG. 2, the array substrate further includes a plurality of white subpixels as compared to the array substrate in FIG. 1. Referring to FIG. 2, the array of a plurality of subpixels are arranged in a plurality of columns and a plurality of rows. The plurality of columns of subpixels are respectively spaced apart by a plurality of inter-subpixel regions, e.g., an inter-subpixel region IR1, an inter-subpixel region IR2, an inter-subpixel region IR3, and an inter-subpixel region IR4 as shown in FIG. 2. The array substrate further includes a plurality of light emitting elements respectively in the plurality of subpixels. As shown in FIG. 2, the plurality of light emitting elements includes a plurality of red light emitting elements R, a plurality of green light emitting elements G, a plurality of blue light emitting elements B, and a plurality of white light emitting elements W.

Referring to FIG. 2, a respective one of the plurality of detection and compensation lead lines SLL is spaced apart by at least one columns of subpixels from any data line. As shown in FIG. 2, the respective one of the plurality of detection and compensation lead lines SLL is spaced apart by a column of subpixel from a most-adjacent data line of the plurality of data lines DL. In some embodiments, in at least a second inter-subpixel region IR2 of the plurality of inter-subpixel regions, two data lines of the plurality of data lines DL are in a same inter-subpixel region between two directly adjacent columns of subpixels. For example, as shown in FIG. 2, in a second inter-subpixel region IR2, two data lines of the plurality of data lines DL are in a same inter-subpixel region between a column of red subpixels and a column of green subpixels; the two data lines of the plurality of data lines DL are configured to respectively transmit data signals to the column of red subpixels and the column of green subpixels. In another example, in a second inter-subpixel region IR2, two data lines of the plurality of data lines DL are in a same inter-subpixel region between a column of white subpixels and a column of red subpixels; the two data lines of the plurality of data lines DL are configured to respectively transmit data signals to the column of white subpixels and the column of red subpixels. In some embodiments, in at least a fourth inter-subpixel region IR4 of the plurality of inter-subpixel regions, only a single data line of the plurality of data lines DL is in a same inter-subpixel region between two directly adjacent columns of subpixels. For example, as shown in FIG. 2, in a fourth inter-subpixel region IR4, a single data line of the plurality of data lines DL is in a same inter-subpixel region between a column of blue subpixels and a column of green subpixels; the single data line of the plurality of data lines DL is configured to respectively transmit data signals to the column of blue subpixels. In another example, in a fourth inter-subpixel region IR4, a single data line of the plurality of data lines DL is in a same inter-subpixel region between a column of white subpixels and a column of red subpixels; the single data line of the plurality of data lines DL is configured to respectively transmit data signals to the column of white subpixels.

Referring to FIG. 2, in some embodiments, a respective one of the plurality of low voltage signal lines Vss and the respective one of the plurality of detection and compensation lead lines SLL are in a same inter-subpixel region between two directly adjacent columns of subpixels Sp. As shown in FIG. 2, the respective one of the plurality of low voltage signal lines Vss and the respective one of the plurality of detection and compensation lead lines SLL are in the first inter-subpixel region IR1 between a column of blue subpixel and a column of white subpixels. In some embodiments, a respective one of the plurality of power supply lines Vdd is disposed in a third inter-subpixel region IR3 between two directly adjacent columns of subpixels. The third inter-subpixel region IR3 is spaced apart from the first inter-subpixel region IR1 by at least one columns of subpixels. As shown in FIG. 2, the third inter-subpixel region IR3 is spaced apart from the first inter-subpixel region IR1 by four columns of subpixels, including a column of white subpixels, a column of red subpixels, a column of green subpixels, and a column of blue subpixels.

In some embodiments, a minimum translational repeating unit of at least a region of the array substrate is defined by two most adjacent power supply lines of the plurality of power supply lines Vdd. In some embodiments, the minimum translational repeating unit of at least the region of the array substrate includes a row of subpixels between the two most adjacent power supply lines of the plurality of power supply lines Vdd, and portions of any signal lines in any inter-subpixels region of the row of subpixels between the two most adjacent power supply lines of the plurality of power supply lines Vdd.

Figure 3:
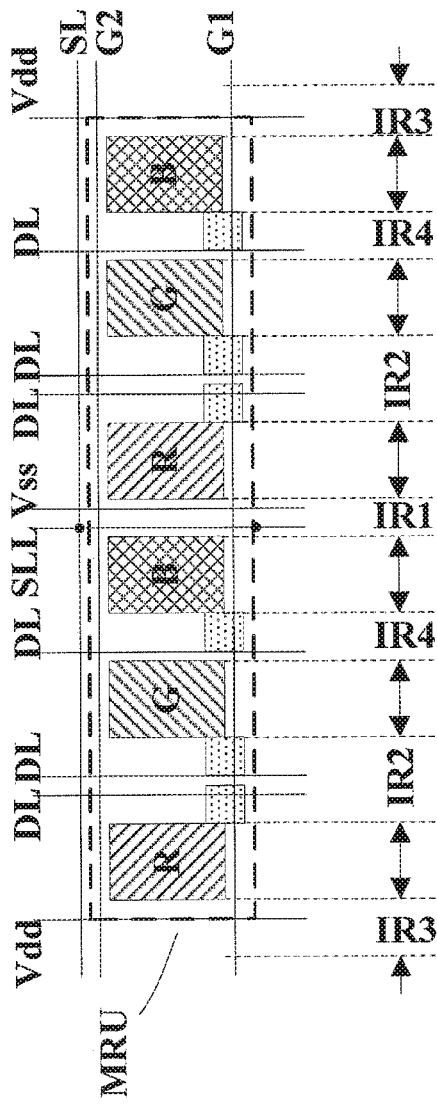
FIG. 3 illustrates a minimum translational repeating unit of at least a region of the array substrate in FIG. 1.

FIG. 3 illustrates a minimum translational repeating unit of at least a region of the array substrate in FIG. 1. Referring to FIG. 3, the minimum translational repeating unit MRU includes a row of six subpixels between two most adjacent power supply lines of the plurality of power supply lines Vdd, and portions of any signal lines in any inter-subpixels region of the row of subpixels between the two most adjacent power supply lines of the plurality of power supply lines Vdd. For example, the minimum translational repeating unit MRU includes two red subpixels, two green subpixels, two blue subpixels, portions of data lines in the inter-subpixel region IR2 and the inter-subpixel region IR4 between the two most adjacent power supply lines of the plurality of power supply lines Vdd, and portions of a respective one of the plurality of low voltage signal lines Vss and a respective one of the plurality of detection and compensation lead lines SLL in the inter-subpixel region IR1 between the two most adjacent power supply lines of the plurality of power supply lines Vdd. In one example, the minimum translational repeating unit MRU includes two pixels, each of which includes a red subpixel, a green subpixel, and a blue subpixel.

Figure 4:
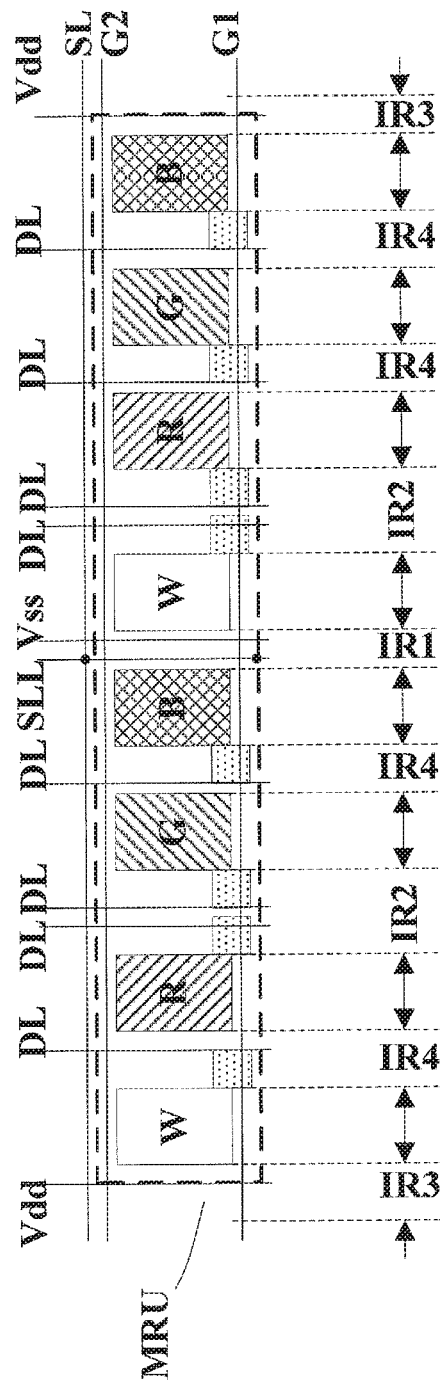
FIG. 4 illustrates a minimum translational repeating unit of at least a region of the array substrate in FIG. 2.

FIG. 4 illustrates a minimum translational repeating unit of at least a region of the array substrate in FIG. 2. Referring to FIG. 4, the minimum translational repeating unit MRU includes a row of eight subpixels between two most adjacent power supply lines of the plurality of power supply lines Vdd, and portions of any signal lines in any inter-subpixels region of the row of subpixels between the two most adjacent power supply lines of the plurality of power supply lines Vdd. For example, the minimum translational repeating unit MRU includes two red subpixels, two green subpixels, two blue subpixels, two white subpixels, portions of data lines in the inter-subpixel region IR2 and the inter-subpixel region IR4 between the two most adjacent power supply lines of the plurality of power supply lines Vdd, and portions of a respective one of the plurality of low voltage signal lines Vss and a respective one of the plurality of detection and compensation lead lines SLL in the inter-subpixel region IR1 between the two most adjacent power supply lines of the plurality of power supply lines Vdd. In one example, the minimum translational repeating unit MRU includes two pixels, each of which includes a red subpixel, a green subpixel, a blue subpixel, and a white subpixel.

In some embodiments, N columns of the plurality of columns of subpixels, N number of data lines of a plurality of data lines DL, the respective one of the plurality of the plurality of detection and compensation lead lines SLL, and a respective one of a plurality of low voltage signal lines Vss are disposed between two most adjacent power supply lines of the plurality of power supply lines Vdd. Optionally, N>2, e.g., N=3, N=4, N=5, N=6, N=7, N=8, N=9, or N=10. Referring to FIG. 1 and FIG. 3, optionally. N=6. Referring to FIG. 2 and FIG. 4, optionally. N=8. Referring to FIGS. 1 to 4, in some embodiments, the respective one of the plurality of the plurality of detection and compensation lead lines SLL and the respective one of a plurality of low voltage signal lines Vss are disposed in a central-most inter-subpixel region between two adjacent central-most columns of the N columns of the plurality of columns of subpixels. For example, the respective one of the plurality of the plurality of detection and compensation lead lines SLL and the respective one of a plurality of low voltage signal lines Vss are disposed in a central-most inter-subpixel region between the two most adjacent power supply lines of the plurality of power supply lines Vdd. In some embodiments, in at least a second inter-subpixel region of the plurality of inter-subpixel regions, two data lines of the plurality of data lines are in a same inter-subpixel region between two directly adjacent columns of subpixels Referring to FIGS. 1 to 4, in some embodiments, the array substrate further includes a plurality of detection and compensation lines SL electrically connected to the plurality of detection and compensation lead lines SLL. In some embodiments, a respective one of the plurality of detection and compensation lines SL electrically connects pixel driving circuits in a respective row of subpixels to a data detection and compensation circuit DDCC. Optionally, a respective one of the plurality of detection and compensation lines SL is disposed in an inter-subpixel region between two directly adjacent rows of subpixels, as shown in FIGS. 1 to 4.

In some embodiments, the array substrate further includes a plurality of first gate lines G1 for controlling a plurality of first thin film transistors in the plurality of pixel driving circuits Pdc and a plurality of second gate lines G2 for controlling a plurality of second thin film transistors in the plurality of pixel driving circuits Pdc. As shown in FIGS. 1 to 4, in some embodiments, the respective one of the plurality of detection and compensation lines SL, a respective one of the plurality of first gate lines G1, and a respective one of the plurality of second gate lines G2 is disposed in a same inter-subpixel region between two directly adjacent rows of subpixels.

Figure 5:
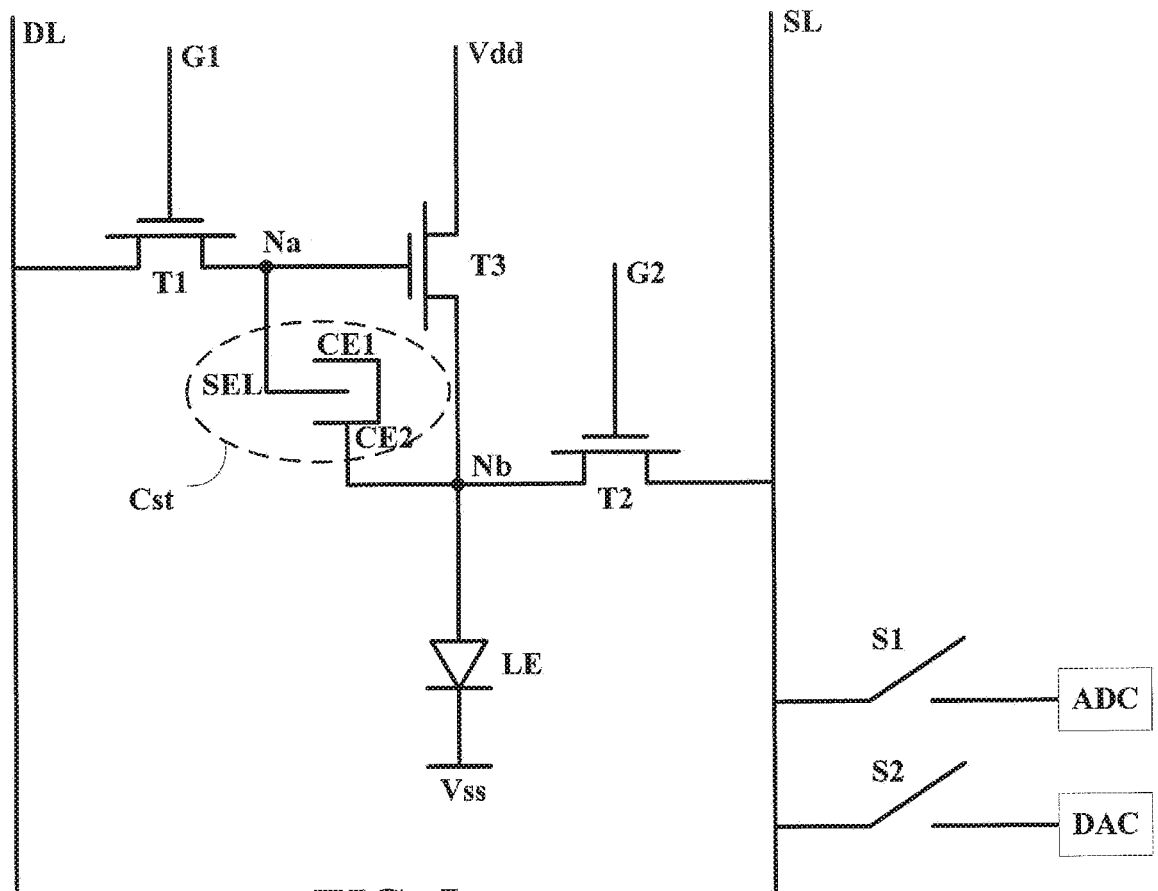
FIG. 5 is a circuit diagram illustrating the structure of a pixel driving circuit in some embodiments according to the present disclosure.
Figure 6:
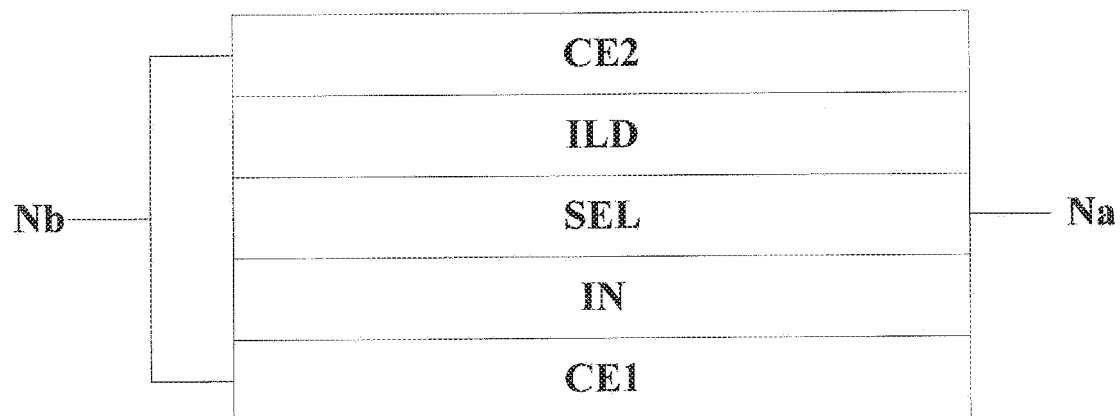
FIG. 6 is a schematic diagram illustrating the structure of a storage capacitor in a pixel driving circuit in some embodiments according to the present disclosure.

FIG. 5 is a circuit diagram illustrating the structure of a pixel driving circuit in some embodiments according to the present disclosure. Referring to FIG. 5, in some embodiments, a respective one of the plurality of pixel driving circuits includes a storage capacitor Cst. In some embodiments, the storage capacitor Cst includes a first capacitor and a second capacitor electrically connected in parallel. FIG. 6 is a schematic diagram illustrating the structure of a storage capacitor in a pixel driving circuit in some embodiments according to the present disclosure. As shown in FIG. 6, the first capacitor in some embodiments includes a semiconductor electrode layer SEL, a first capacitor electrode CE1, and an insulating layer IN between the semiconductor electrode layer SEL and the first capacitor electrode CE1. The second capacitor includes the semiconductor electrode layer SEL, a second capacitor electrode CE2, and an inter-layer dielectric layer ILD between the semiconductor electrode layer SEL and the second capacitor electrode CE2. The semiconductor electrode layer SEL is connected to a first node Na in the respective one of the plurality of pixel driving circuits. The first capacitor electrode CE1 and the second capacitor electrode CE2 are connected to a second node Nb in the respective one of the plurality of pixel driving circuits.

Various appropriate pixel driving circuits may be used in the present array substrate. Examples of appropriate driving circuits include 3TIC, 2T1C, 4T1C, 4T2C, 5T2C, 6T1C, 7T1C, and 7T2C. In some embodiments, the respective one of the plurality of pixel driving circuits is a 3T1C driving circuit. Referring to FIG. 5, the respective one of the plurality of pixel driving circuits in some embodiments includes a switching thin film transistor T1, a detection switch thin film transistor T2, a driving thin film transistor T3, and the storage capacitor Cst. In one example, a source electrode of the switching thin film transistor T1 is connected to a respective one of a plurality of data lines DL; a drain electrode of the switching thin film transistor T1 is connected to the semiconductor electrode layer SEL and to a gate electrode of the driving thin film transistor T3; a gate electrode of the switching thin film transistor T1 is connected to a respective one of a plurality of first gate lines G1; a source electrode of the driving thin film transistor T3 is connected to a respective one of the plurality of power supply lines Vdd; a drain electrode of the driving thin film transistor T3 is connected to a light emitting element LE in a respective one of the plurality of subpixels; a gate electrode of the driving thin film transistor T3 is connected to a drain electrode of the switching thin film transistor T1 and to the semiconductor electrode layer SEL; a source electrode of the detection switch thin film transistor T2 is connected to the drain electrode of the driving thin film transistor T3 and to the first capacitor electrode CE1 and to the second capacitor electrode CE2; a drain electrode of the detection switch thin film transistor T2 is connected to the respective one of the respective one of the plurality of detection and compensation lines SL; and a gate electrode of the detection switch thin film transistor T2 is connected to a respective one of a plurality of second gate lines G2.

In some embodiments, the respective one of the plurality of pixel driving circuits is configured to be operated in five phases. In the first phase, the respective one of the plurality of first gate lines G1 and the respective one of the plurality of second gate lines G2 are both configured to transmit an OFF signal, turning off the switching thin film transistor T1 and the detection switch thin film transistor T2, respectively. The driving thin film transistor T3 is in an initialized off state in the first phase.

In the second phase, the respective one of the plurality of first gate lines G1 and the respective one of the plurality of second gate lines G2 are both configured to transmit an ON signal, turning on the switching thin film transistor T1 and the detection switch thin film transistor T2, respectively. The respective one of the plurality of data lines DL is configured to transmit a reference data voltage (Vref) in the second phase. The reference data voltage Vref is transmitted to the first node Na via the switching thin film transistor T1, e.g., the reference data voltage Vref is written to the gate electrode of the driving thin film transistor T3, and the reference data voltage Vref can be stored and maintained by the storage capacitor Cst. The respective one of the plurality of detection and compensation lines SL transmits a first detection writing voltage (V1), through the detection switch thin film transistor T2, to the drain electrode of the driving thin film transistor T3, e.g., the second node Nb. The first detection writing voltage V1 is written to the drain electrode of the driving thin film transistor T3. Thus, in the second phase, the gate voltage of the driving thin film transistor T3 is Vref and the drain voltage is V1, the gate-drain voltage Vgd=Vref−V1. Therefore, the driving thin film transistor T3 can be turned on by setting a magnitude relationship between the reference data voltage Vref and the first detection writing voltage V1, thereby allowing the respective one of the plurality of detection and compensation lines SL to be electrically connected to the respective one of the plurality of power supply lines Vdd, and charging or discharging the storage capacitor Cst. Optionally, the storage capacitor Cst may be charged for a first charging duration t1.

In some embodiments, the respective one of the plurality of pixel driving circuits further includes an analog to digital converter ADC electrically connected to the respective one of the plurality of detection and compensation lines SL. During the second phase, the detection switch thin film transistor T2 is configured to receive the first detection writing voltage V1 from the analog to digital converter ADC, and is configured to transmit the first detection writing voltage V1 to the drain electrode of the driving thin film transistor T3.

In one example, the threshold voltage of the driving thin film transistor T3 is negatively drifted due to aging or deterioration, e.g., the threshold voltage becomes less than zero. The reference data voltage Vref can be set less than or equal to the first detection writing voltage V1. The reference data voltage Vref and the first detection writing voltage V1 can be set to be close to each other. In one example, Vref=V1=0.2 V. In another example, Vref=0 and V1=0.2 V. In the second phase, where the threshold voltage of the driving thin film transistor T3 is less than 0, the driving thin film transistor T3 is turned on. As the charging progresses, the voltage of the second node Nb gradually increases. After the first charging duration t1, the difference between the voltages of the first node Na and the second node Nb (e.g., the difference Vgd between the voltages of the gate electrode and the drain electrode of the driving thin film transistor T3) becomes equal to the threshold voltage of the driving thin film transistor T3. Subsequently, the driving thin film transistor T3 is turn off, and the charging process ends.

In the third phase, the respective one of the plurality of detection and compensation lines SL is configured to read the voltage of the drain electrode of the driving thin film transistor T3 to obtain a first detection reading voltage Vsig. In some embodiments, the respective one of the plurality of pixel driving circuits further includes a digital to analog converter DAC electrically connected to the respective one of the plurality of detection and compensation lines SL. The detection switch thin film transistor T2 is configured to transmit the first detection reading voltage Vsig to the digital to analog converter DAC. During the third phase, the digital to analog converter DAC reads the voltage of the drain electrode of the driving thin film transistor T3 via the detection switch thin film transistor T2, and records the first detection reading voltage Vsig. In one example, the detected threshold voltage Vth of the driving thin film transistor T3 may be approximated as (Vref−Vsig). Considering that the measurement for Vsig may have a certain error for various reasons (for example, insufficient charging due to that the first charging duration t1 is not long enough), this relationship is not always true. For example, in the second phase, the driving thin film transistor T3 is turned on, because Vgd>Vth, Vref−V1>Vth in the third phase, and because Vgd≤Vth, (Vref−Vsig)≤Vth, and therefore the detected threshold voltage Vth of the driving thin film transistor T3 has a numerical range of [Vref-Vsig, Vref-V1].

In the fourth phase, whether or not the detected threshold voltage Vth approximates (Vref-Vsig) is verified. In the fourth phase, for verification purpose, the reference data voltage Vref is written to the gate electrode of the driving thin film transistor T3, and the first detection reading voltage Vsig is applied to the drain electrode of the driving thin film transistor T3. In one example, the fourth phase include a first period and a second period. In the first period, the respective one of the plurality of first gate lines G1 and the respective one of the plurality of second gate lines G2 are both configured to transmit an ON signal, turning on the switching thin film transistor T1 and the detection switch thin film transistor T2, respectively. The respective one of the plurality of data lines DL is configured to transmit the reference data voltage Vref to the first node Na via the switching thin film transistor T1, e.g., the reference data voltage Vref is written to the gate electrode of the driving thin film transistor T3. The first detection reading voltage Vsig is written to the second node Nb, e.g., first detection reading voltage Vsig is transmitted to the drain electrode of the driving thin film transistor T3.

In the second period, the respective one of the plurality of first gate lines G1 and the respective one of the plurality of second gate lines G2 are both configured to transmit an OFF signal, turning off the switching thin film transistor T1 and the detection switch thin film transistor T2, respectively. In the second period, if the light emitting element LE does not emit light, the detection process ends, and the threshold voltage of the driving transistor of the pixel circuit is obtained. In the second period, if the light emitting element LE emits light, it is indicated that the value or the value range of the threshold voltage of the driving thin film transistor T3 is too large and can be further adjusted.

In order to obtain the correct threshold voltage of the driving thin film transistor T3, a multiple approximation method can be used. For example, when a same reference data voltage Vref is written to the gate electrode of the driving thin film transistor T3, a value larger than the first detection reading voltage Vsig can be directly selected as the second detection reading voltage Vsig2 to be written to the drain electrode of the driving thin film transistor T3, and observe whether the light emitting element LE emits light. Where the light emitting element LE does not emit light, the detection process ends; where the light emitting element LE still emits light, the second detection reading voltage Vsig2 is increased to repeat the above process until the light emitting element LE does not emit light when a N-th detection reading voltage Vsign is written to the drain electrode of the driving thin film transistor T3, and the detection process ends. The detected threshold voltage Vth=Vref−Vsign.

In another example, the second phase and the third phase can be repeated, and the first charging duration t1 in the third phase is increased, and therefore a second detection reading voltage Vsig2 is obtained, and then a second period of the fourth phase is performed. In the second period, the second detection reading voltage Vsig2 is written to the drain electrode of the driving thin film transistor T3 to observe whether the light emitting element LE emits light. Where the light emitting element LE does not emit light, the detection process ends; where the light emitting element LE still emits light, the second phase and the third phase are continuously repeated, and the first charging duration t1 in the third phase is continuously increased, and another second period of the fourth phase is performed until the N-th detection reading voltage Vsign is obtained, and the light emitting element LE does not emit light where the N-th detection reading voltage Vsign is written to the drain electrode of the driving thin film transistor T3, the detection process ends. The detected threshold voltage Vth=Vref−Vsign.

In the fifth phase, the respective one of the pixel driving circuit is reset. In one example, the respective one of the plurality of first gate lines G1 and the respective one of the plurality of second gate lines G2 are both configured to transmit an OFF signal, turning off the switching thin film transistor T1 and the detection switch thin film transistor T2, respectively, and the respective one of the pixel driving circuits gradually returns to a state in the first phase. In another example, the respective one of the plurality of first gate lines G1 is configured to transmit an OFF signal, turning off the switching thin film transistor T1; and the respective one of the plurality of second gate lines G2 is configured to transmit an ON signal, turning on the detection switch thin film transistor T2. A low voltage (e.g., a reset voltage) is applied to the respective one of the plurality of detection and compensation lines SL, thereby resetting the second node Nb.

Figure 7:
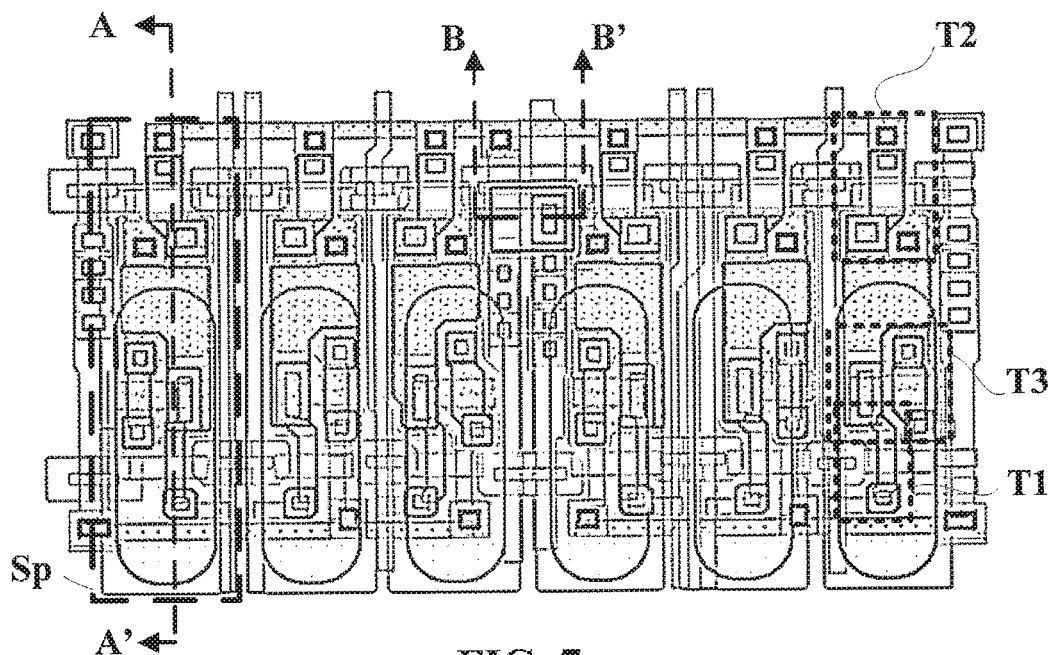
FIG. 7 is a plan view of a minimum translational repeating unit of an array substrate in some embodiments according to the present disclosure.
Figure 8:
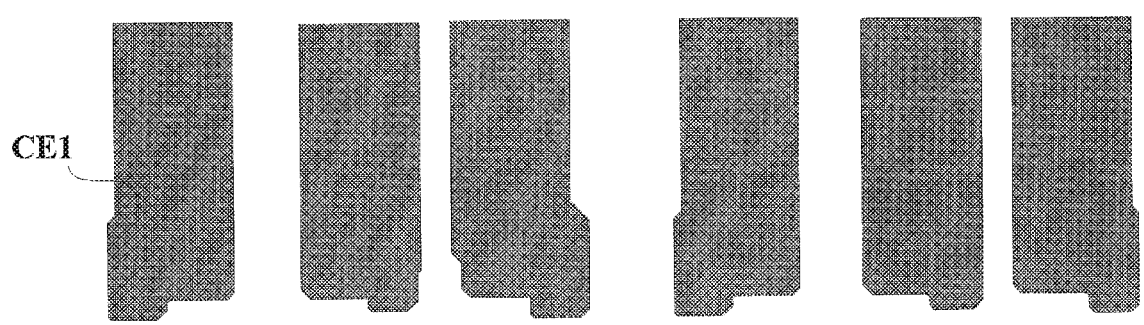
FIG. 8 is a plan view of a first capacitor electrode of the minimum translational repeating unit of FIG. 7.
Figure 9:
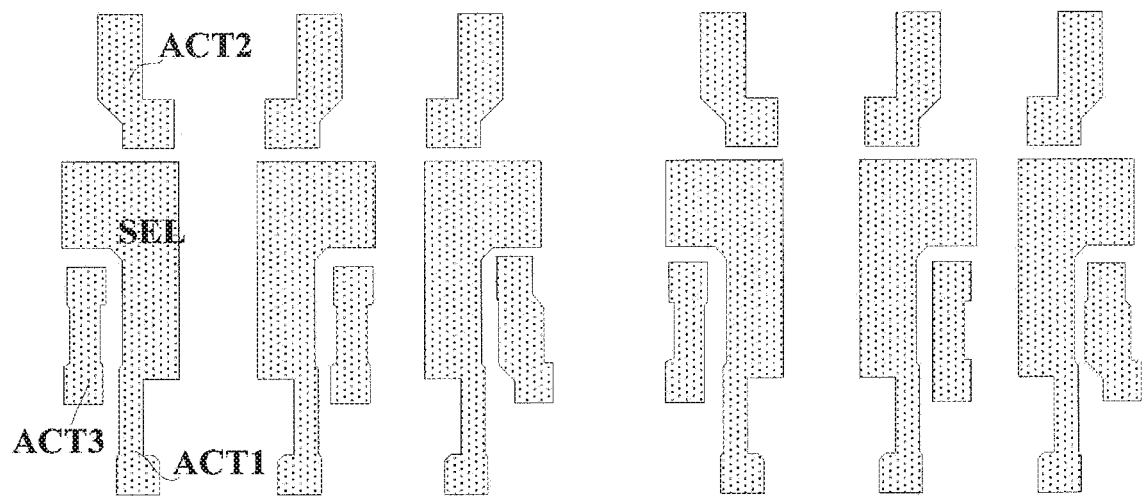
FIG. 9 is a plan view of a semiconductor electrode layer and active layers of the minimum translational repeating unit of FIG. 7.
Figure 10:
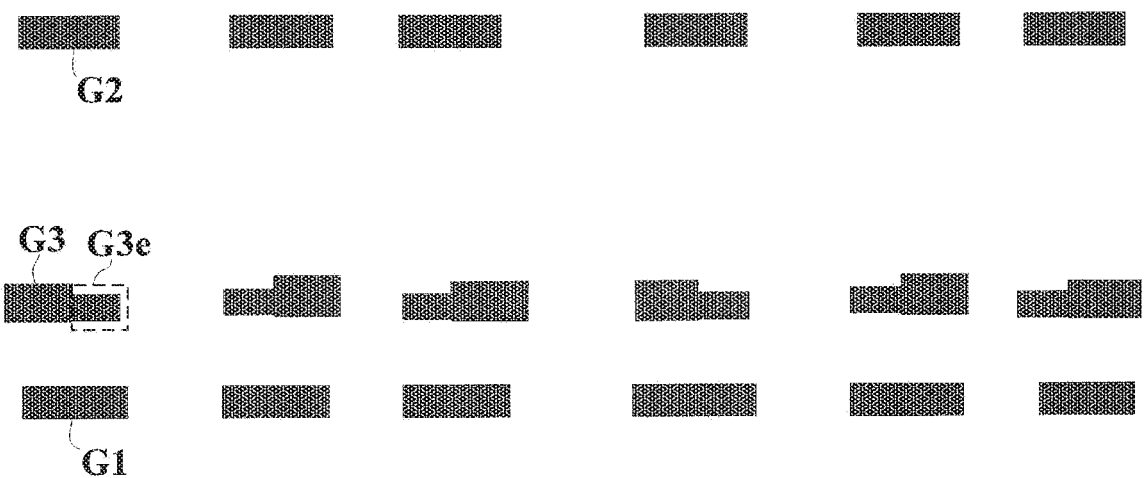
FIG. 10 is a plan view of gate electrodes of the minimum translational repeating unit of FIG. 7.
Figure 11:
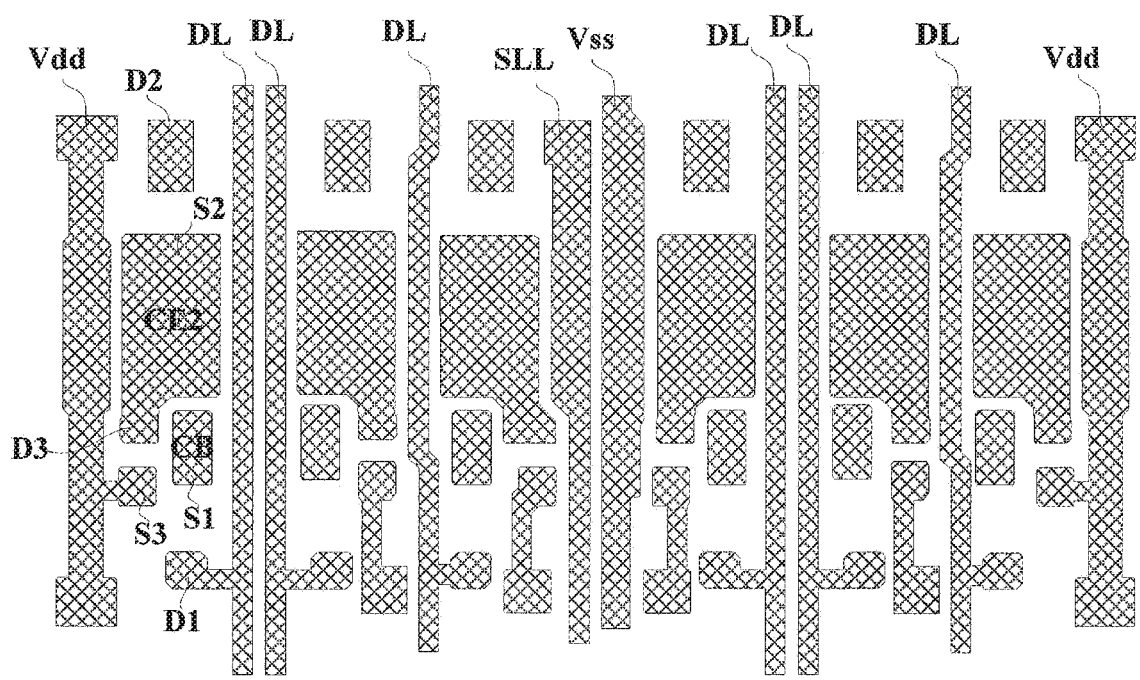
FIG. 11 is a plan view of a layer having a source electrode and a drain electrode of the minimum translational repeating unit of FIG. 7.
Figure 12:
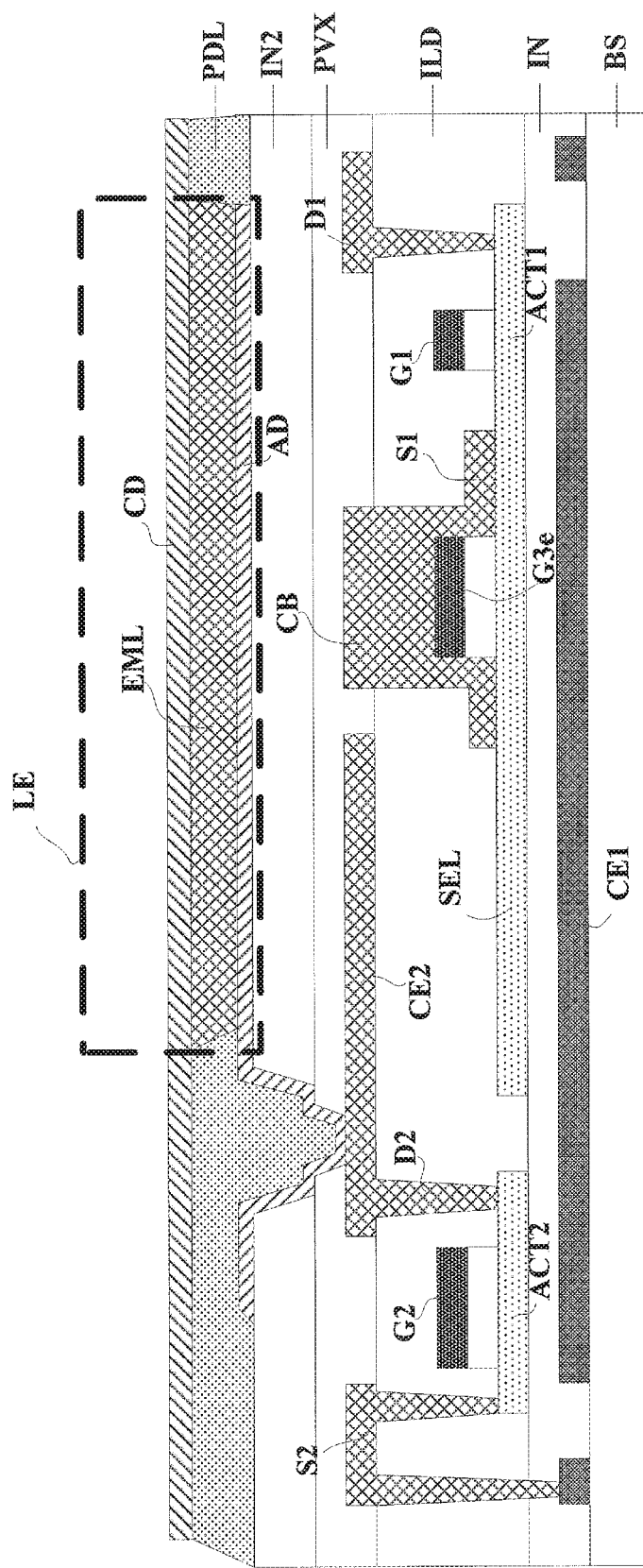
FIG. 12 is a cross-sectional view along an A-A' line of the minimum translational repeating unit of FIG. 7.

FIG. 7 is a plan view of a minimum translational repeating unit of an array substrate in some embodiments according to the present disclosure. FIG. 8 is a plan view of a first capacitor electrode of the minimum translational repeating unit of FIG. 7. FIG. 9 is a plan view of a semiconductor electrode layer and active layers of the minimum translational repeating unit of FIG. 7. FIG. 10 is a plan view of gate electrodes of the minimum translational repeating unit of FIG. 7. FIG. 11 is a plan view of a layer having a source electrode and a drain electrode of the minimum translational repeating unit of FIG. 7. FIG. 12 is a cross-sectional view along an A-A' line of the minimum translational repeating unit of FIG. 7. Referring to FIGS. 7 to 12, a respective one of the plurality of subpixel Sp includes a respective one of the plurality of pixel driving circuit. Each of the plurality of pixel driving circuit includes a switching thin film transistor T1, a detection switch thin film transistor T2, and a driving thin film transistor T3. The switching thin film transistor T1 includes a gate electrode G1, a source electrode S1, a drain electrode D1, and an active layer ACT1. The detection switch thin film transistor T2 includes a gate electrode G2, a source electrode S2, a drain electrode D2, and an active layer ACT2. The driving thin film transistor T3 includes a gate electrode G3, a source electrode S3, a drain electrode D3, and an active layer ACT3.

In some embodiments, the first capacitor electrode CE1 is configured to at least partially shield light irradiating on an active layer of a thin film transistor in the respective one of the plurality of pixel driving circuits. Referring to FIG. 8 and FIG. 12, in one example, the first capacitor electrode CE1 is configured to at least partially shield light irradiating on the active layer ACT3 of the driving thin film transistor T3. Moreover, the first capacitor electrode CE1 is configured to at least partially shield light irradiating on the semiconductor electrode layer SEL. Optionally, an orthographic projection of the first capacitor electrode CE1 on a base substrate BS at least partially overlapping with an orthographic projection of the active layer ACT3 of the driving thin film transistor T3 in the respective one of the plurality of pixel driving circuits on the base substrate BS. Optionally, the orthographic projection of the first capacitor electrode CE1 on the base substrate BS at least partially overlapping with an orthographic projection of the semiconductor electrode layer SEL in the respective one of the plurality of pixel driving circuits on the base substrate BS.

In some embodiments, the second capacitor electrode CE2 is in a same layer as a source electrode of the thin film transistor in the respective one of the plurality of pixel driving circuits. Referring to FIG. 10 and FIG. 12, in one example, the second capacitor electrode CE2 is in a same layer as the source electrode S2 of the detection switch thin film transistor T2. Moreover, the second capacitor electrode CE2 is in a same layer as the drain electrode D1 of the switching thin film transistor T1. Optionally, the second capacitor electrode CE2 is in a same layer as the connection bridge CB electrically connecting the semiconductor electrode layer SEL and the active layer ACT1 of the switching thin film transistor T1.

As used herein, the term "same layer" refers to the relationship between the layers simultaneously formed in the same step. In one example, the second capacitor electrode CE2, the source electrode S2 of the detection switch thin film transistor T2, the drain electrode D1 of the switching thin film transistor T1, and the connection bridge CB are in a same layer when they are formed as a result of one or more steps of a same patterning process performed in a same layer of material. In another example, the second capacitor electrode CE2, the source electrode S2 of the detection switch thin film transistor T2, the drain electrode D1 of the switching thin film transistor T1, and the connection bridge CB can be formed in a same layer by simultaneously performing the step of forming the second capacitor electrode CE2, the step of forming the source electrode S2 of the detection switch thin film transistor T2, the step of forming the drain electrode D1 of the switching thin film transistor T1, and the step of forming the connection bridge CB. The term "same layer" does not always mean that the thickness of the layer or the height of the layer in a cross-sectional view is the same.

In some embodiments, and referring to FIG. 9 and FIG. 12, the semiconductor electrode layer SEL and an active layer ACT1 of the switching thin film transistor T1 are parts of a unitary structure.

Figure 13:
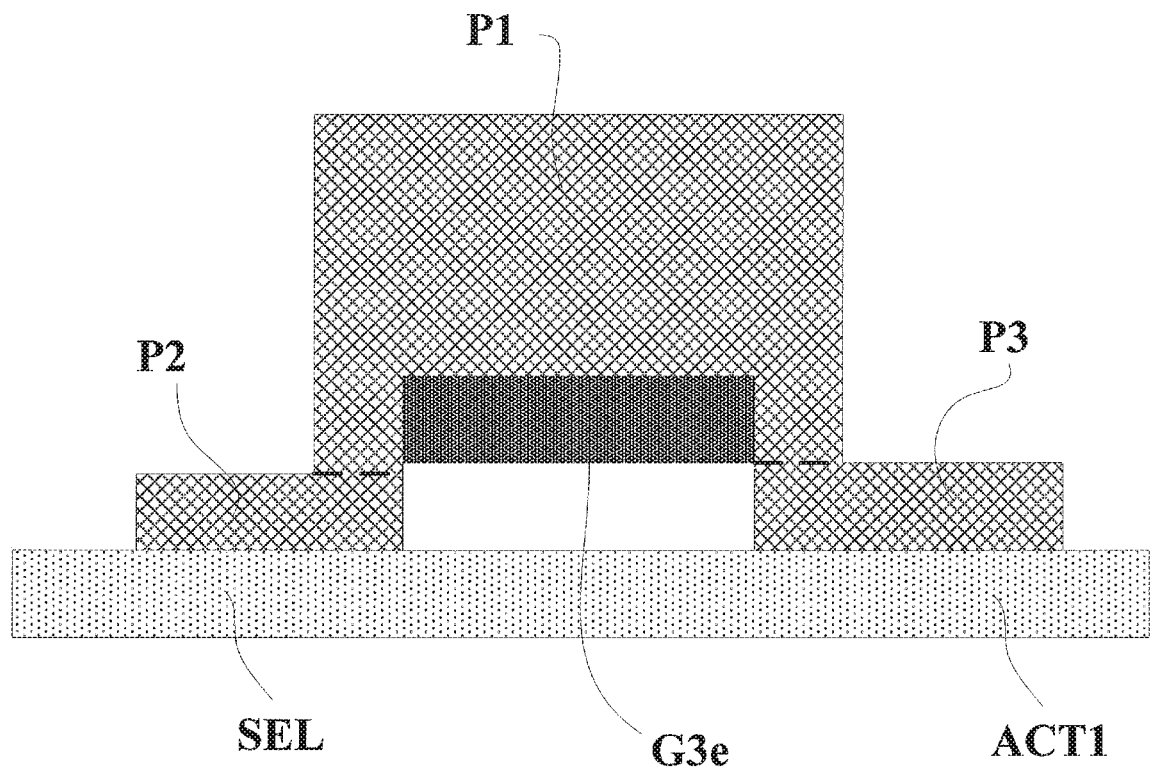
FIG. 13 is a schematic diagram illustrating the structure of a connection bridge in some embodiments according to the present disclosure.

In some embodiments, and referring to FIG. 10 and FIG. 12, the gate electrode G3 of the driving thin film transistor T3 includes an extension portion G3e. Optionally, the connection bridge CB is on a side of an extension portion G3e of the gate electrode G3 of the driving thin film transistor T3 away from the base substrate BS. FIG. 13 is a schematic diagram illustrating the structure of a connection bridge in some embodiments according to the present disclosure. Referring to FIG. 13, in some embodiments, the connection bridge CB includes a first portion P1 in direct contact with the extension portion G3e of the gate electrode G3 of the driving thin film transistor T3, a second portion P2 in direct contact with the semiconductor electrode layer SEL, and a third portion P3 in direct contact with the active layer ACT1 of the switching thin film transistor T1. Optionally, referring to FIGS. 11 to 13, the third portion P3 functions as the source electrode S1 of the switching thin film transistor T1.

In some embodiments, and referring to FIG. 11, the connection bridge CB is in a same layer as the source electrode S3 and the drain electrode D3 of the driving thin film transistor T3. Referring to FIG. 12, the connection bridge CB extends through the inter-layer dielectric layer ILD respectively on two sides of the extension portion G3e of the gate electrode G3 of the driving thin film transistor T3 to respectively connected to the two portions (P2 and P3) of the semiconductor electrode layer SEL. Referring to FIGS. 10 to 13, optionally, an orthographic projection of the connection bridge CB on the base substrate BS partially overlaps with an orthographic projection of the gate electrode G3 of the driving thin film transistor T3 on the base substrate BS. In one example, the orthographic projection of the connection bridge CB on the base substrate BS partially overlaps with an orthographic projection of the extension portion G3e of the gate electrode G3 of the driving thin film transistor T3 on the base substrate BS.

In some embodiments, and referring to FIG. 11 and FIG. 12, the second capacitor electrode CE2, the source electrode S2 of the detection switch thin film transistor T2, and the drain electrode D3 of driving thin film transistor T3 in the respective one of the plurality of pixel driving circuits are parts of a unitary structure. Referring to FIG. 12, in some embodiments, the array substrate further includes a passivation layer PVX between the second capacitor electrode CE2 and an anode AD of a light element LE in a respective one of the plurality of subpixels. The anode AD of the light element LE in the respective one of the plurality of subpixels extends through the passivation layer PVX to connect to the unitary structure.

The array substrate in some embodiments further includes a second insulating layer IN2 (e.g., a resin layer) on a side of the passivation layer PVX away from the base substrate BS; and a pixel definition layer PDL on a side of the second insulating layer IN2 away from the base substrate BS. The pixel definition layer PDL defines a subpixel aperture for receiving a light emitting layer EML of the light element LE. The light element LE further includes a cathode CD on a side of the light emitting layer EML away from the anode AD.

Figure 14:
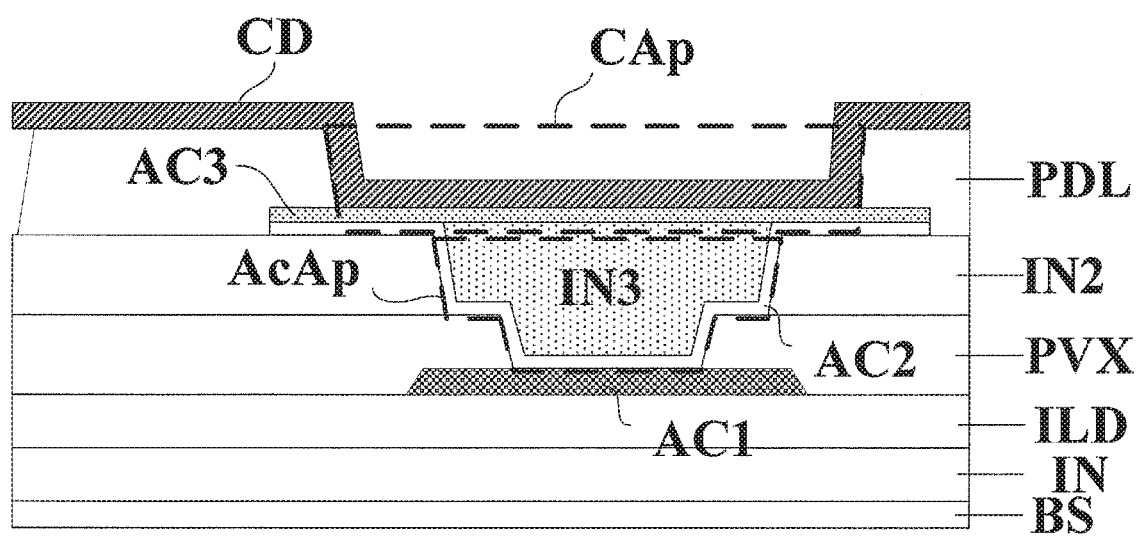
FIG. 14 is a cross-sectional view along a B-B' line of the minimum translational repeating unit of FIG. 7.

In some embodiments, the array substrate further includes an auxiliary cathode on a base substrate and electrically connected to a respective one of the plurality of low voltage signal lines. FIG. 14 is a cross-sectional view along a B-B' line of the minimum translational repeating unit of FIG. 7. Referring to FIG. 7, FIG. 11, and FIG. 14, the array substrate further includes an auxiliary cathode AC1 on a base substrate BS. The auxiliary cathode AC1 is electrically connected to a respective one of the plurality of low voltage signal lines Vss. Optionally, a cathode CD of a light emitting element extends through at least the passivation layer PVX to connect to the auxiliary cathode AC1.

In some embodiments, and as shown in FIG. 14, the array substrate further includes a second auxiliary cathode AC2 on a side of the second insulating layer IN2 away from the base substrate BS; a third insulating layer IN3 on a side of the second auxiliary cathode AC2 away from the base substrate BS; a third auxiliary cathode AC3 on a side of the second auxiliary cathode AC2 and the third insulating layer IN3 away from the base substrate BS; and a pixel definition layer PDL on a side of the third insulating layer IN3 away from the base substrate BS. The third insulating layer IN3 is sandwiched between the second auxiliary cathode AC2 and third auxiliary cathode AC3.

Referring to FIG. 14, the array substrate has a cathode aperture CAp extending through the pixel definition layer PDL and an auxiliary cathode aperture AcAp extending through the second insulating layer IN2 and the passivation layer PVX and exposing a surface of the auxiliary cathode AC1. The cathode CD extends into the cathode aperture CAp to electrically connect with the second auxiliary cathode AC2 through the third auxiliary cathode AC3. The second auxiliary cathode AC2 extends into the auxiliary cathode aperture AcAp to electrically connect with the auxiliary cathode AC1. In some embodiments, the cathode CD is not in direct contact with the second auxiliary cathode AC2 and is not in direct contact with the third insulating layer IN3. The second auxiliary cathode AC2 and the third insulating layer IN3 are spaced apart from the cathode CD by the third auxiliary cathode AC3.

In some embodiments, the cathode CD is in direct contact with the third auxiliary cathode AC3. As shown in FIG. 14, in some embodiments, the second auxiliary cathode AC2 and the third insulating layer IN3 together form a substantially flat surface, and the third auxiliary cathode AC3 is formed on the substantially flat surface. In turn, the portion of the cathode CD in the cathode aperture CAp is formed on a substantially flat surface of the third auxiliary cathode AC3. As used herein, the term "substantially flat surface" may include small deviations from flat surface geometries, for example, deviations due to manufacturing processes.

Figure 15:
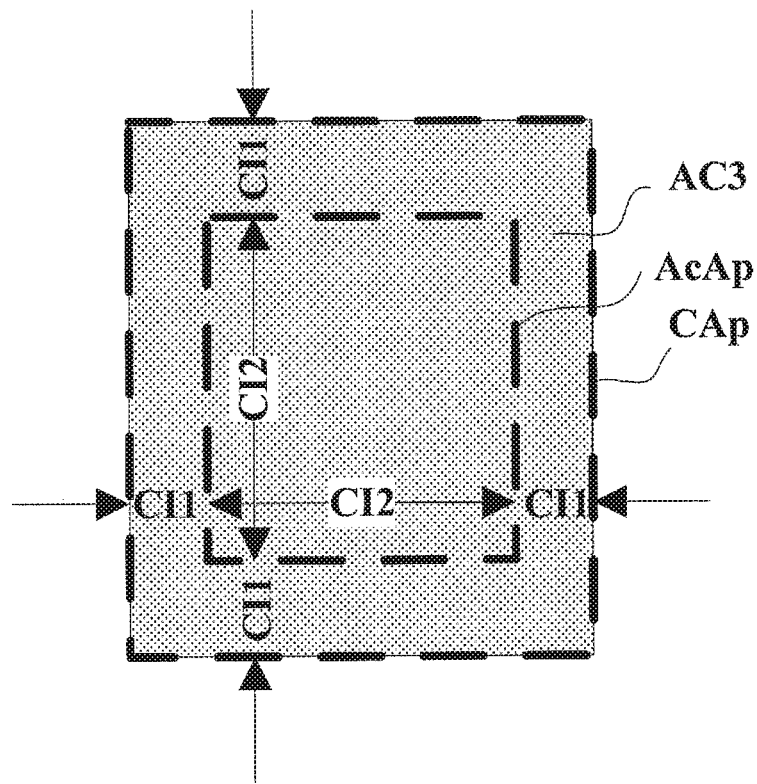
FIG. 15 is a plan view of a third auxiliary cathode in an array substrate in some embodiments according to the present disclosure.

In some embodiments, the third auxiliary cathode AC3 is in direct contact with the second auxiliary cathode AC2 and is in direct contact with the third insulating layer IN3. FIG. 15 is a plan view of a third auxiliary cathode in an array substrate in some embodiments according to the present disclosure. Referring to FIG. 15, a direct contacting interface CI1 between the third auxiliary cathode AC3 and the second auxiliary cathode AC2 substantially surrounds a direct contacting interface CI2 between the third auxiliary cathode AC3 and the third insulating layer IN3. Optionally, the direct contacting interface CI1 and the direct contacting interface CI2 abut each other, forming a unitary contacting interface, as shown in FIG. 15.

Referring to FIG. 14, in some embodiments, the cathode CD is substantially outside the auxiliary cathode aperture AcAp. In some embodiments, the third insulating layer IN3 is substantially inside the auxiliary cathode aperture AcAp. As used herein, the term "substantially outside" refers to at least 70% outside, e.g., at least 75% outside, at least 80% outside, at least 85% outside, at least 90% outside, at least 95% outside, at least 99% outside, or completely outside, a target space. As used herein, the term "substantially inside" refers to at least 70% inside, e.g., at least 75% inside, at least 80% inside, at least 85% inside, at least 90% inside, at least 95% inside, at least 99% inside, or completely inside, a target space.

Figure 16:
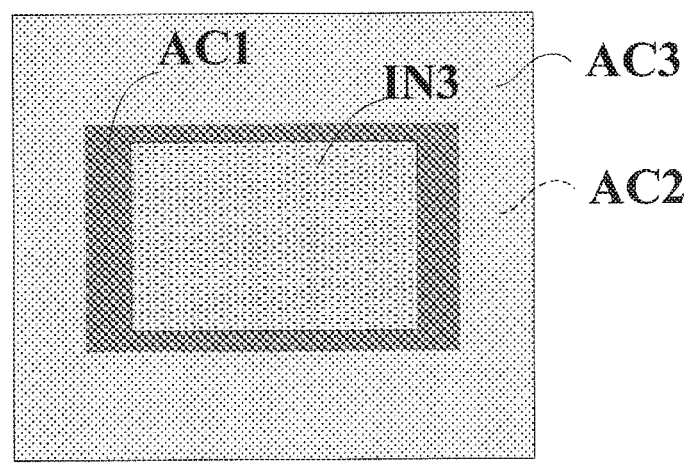
FIG. 16 is a plan view of an auxiliary cathode, a second auxiliary cathode, a third auxiliary cathode, and a third insulating layer in an array substrate in some embodiments according to the present disclosure.

FIG. 16 is a plan view of an auxiliary cathode, a second auxiliary cathode, a third auxiliary cathode, and a third insulating layer in an array substrate in some embodiments according to the present disclosure. Referring to FIG. 14 and FIG. 16, in some embodiments, an orthographic projection of the second auxiliary cathode AC2 on the base substrate BS substantially covers an orthographic projection of the third insulating layer IN3 on the base substrate BS. In some embodiments, an orthographic projection of the third auxiliary cathode AC3 on the base substrate BS substantially covers the orthographic projection of the third insulating layer IN3 on the base substrate BS. As used herein, the term "substantially covers" refers to one orthographic projection being at least 50%, at least 60%, at least 70%, at least 80%, at least 90%, at least 95%, at least 99%, or 100% covered by another orthographic projection. Optionally, the orthographic projection of the second auxiliary cathode AC2 on the base substrate BS and the orthographic projection of the third auxiliary cathode AC3 on the base substrate BS substantially overlap with each other. As used herein, the term "substantially overlap" refers to two orthographic projections at least 50%, e.g., at least 60%, at least 70%, at least 80%, at least 90%, at least 95%, at least 99%, overlapping with each other.

In some embodiments, an orthographic projection of the second auxiliary cathode AC2 on the base substrate BS substantially covers an orthographic projection of the auxiliary cathode AC1 on the base substrate BS. In some embodiments, an orthographic projection of the third auxiliary cathode AC3 on the base substrate BS substantially covers the orthographic projection of the auxiliary cathode AC1 on the base substrate BS. In some embodiments, an orthographic projection of the third insulating layer IN3 on the base substrate NS substantially covers an orthographic projection of the auxiliary cathode AC1 on the base substrate BS. In some embodiments, the orthographic projection of the third insulating layer IN3 on the base substrate BS substantially covers the orthographic projection of the auxiliary cathode AC1 on the base substrate BS. In some embodiments, the orthographic projection of the auxiliary cathode AC1 on the base substrate BS substantially covers the orthographic projection of the third insulating layer IN3 on the base substrate BS.

Various appropriate materials and various appropriate fabricating methods may be used to make the cathode CD. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the cathode CD include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the cathode CD is made of a substantially transparent conductive material such as an oxide semiconductor material.

Various appropriate materials and various appropriate fabricating methods may be used to make the anode AD. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the anode AD include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the anode AD is made of an oxide semiconductor material.

Various appropriate electrode materials and various appropriate fabricating methods may be used for making the auxiliary electrode AC1. For example, an electrode material may be deposited on the substrate (e.g., by sputtering, vapor deposition, solution coating, or spin coating); and patterned (e.g., by lithography such as a wet etching process) to form the auxiliary electrode AC1. Examples of appropriate electrode materials for making the auxiliary electrode AC1 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the auxiliary electrode AC1 is made of a metallic material.

Various appropriate materials and various appropriate fabricating methods may be used to make the second auxiliary electrode AC2. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the second auxiliary electrode AC2 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the second auxiliary electrode AC2 is made of a substantially transparent conductive material such as an oxide semiconductor material. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

Optionally, the second auxiliary electrode AC2 and the anode AD are in a same layer and includes a same material.

Various appropriate materials and various appropriate fabricating methods may be used to make the third auxiliary electrode AC3. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the third auxiliary electrode AC3 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the third auxiliary electrode AC3 is made of a substantially transparent conductive material such as an oxide semiconductor material.

Various appropriate insulating materials and various appropriate fabricating methods may be used to make the passivation layer PVX. For example, an insulating material may be deposited on the substrate by a plasma-enhanced chemical vapor deposition (PECVD) process. Examples of appropriate insulating materials for making the passivation layer PVX include, but are not limited to, silicon oxide ($SiO_y$), silicon nitride ($SiN_y$, e.g., $Si_3N_4$, silicon oxynitride ($SiO_xN_y$), a resin, and polyimide.

Various appropriate insulating materials and various appropriate fabricating methods may be used to make the pixel definition layer PDL. For example, an insulating material may be deposited on the substrate by a plasma-enhanced chemical vapor deposition (PECVD) process. Examples of appropriate insulating materials for making the pixel definition layer PDL include, but are not limited to, silicon oxide ($SiO_y$), silicon nitride ($SiN_y$, e.g., $Si_3N_4$, silicon oxynitride ($SiO_rN_y$), a resin, a photoresist material, and polyimide.

Various appropriate insulating materials and various appropriate fabricating methods may be used to make the insulating layer IN, the second insulating layer IN2, and the third insulating layer IN3. For example, an insulating material may be deposited on the substrate by a plasma-enhanced chemical vapor deposition (PECVD) process. Examples of appropriate insulating materials for making the insulating layer IN, the second insulating layer IN2, and the third insulating layer IN3 include, but are not limited to, silicon oxide ($SiO_y$), silicon nitride ($SiN_y$, e.g., $Si_3N_4$), silicon oxynitride ($SiO_xN_y$), and various organic polymers such as a resin, a photoresist material, and polyimide.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

In another aspect, the present invention provides a pixel driving circuit. In some embodiments, the pixel driving circuit includes a storage capacitor. Optionally, the storage capacitor includes a first capacitor and a second capacitor electrically connected in parallel. Optionally, the first capacitor includes a semiconductor electrode layer, a first capacitor electrode, and an insulating layer between the semiconductor electrode layer and the first capacitor electrode. Optionally, the second capacitor includes the semiconductor electrode layer, a second capacitor electrode, and an inter-layer dielectric layer between the semiconductor electrode layer and the second capacitor electrode. Optionally, the first capacitor electrode is configured to at least partially shield light irradiating on an active layer of a thin film transistor in the respective one of the plurality of pixel driving circuits. Optionally, an orthographic projection of the first capacitor electrode on a base substrate at least partially overlapping with an orthographic projection of the active layer of the thin film transistor in the respective one of the plurality of pixel driving circuits on the base substrate. Optionally, the second capacitor electrode is in a same layer as a source electrode of the thin film transistor in the respective one of the plurality of pixel driving circuits.

In some embodiments, the pixel driving circuit further includes a driving thin film transistor and a switching thin film transistor. Optionally, a source electrode of the switching thin film transistor is connected to a respective one of a plurality of data lines; a drain electrode of the switching thin film transistor is connected to the semiconductor electrode layer; and a gate electrode of the switching thin film transistor is connected to a respective one of a plurality of first gate lines. Optionally, a source electrode of the driving thin film transistor is connected to a respective one of the plurality of power supply lines; a drain electrode of the driving thin film transistor is connected to a light emitting element in a respective one of the plurality of subpixels; and a gate electrode of the driving thin film transistor is connected to a drain electrode of the switching thin film transistor. Optionally, the semiconductor electrode layer and an active layer of the switching thin film transistor are parts of a unitary structure. Optionally, the respective one of the plurality of pixel driving circuits includes a connection bridge electrically connecting the semiconductor electrode layer and the active layer of the switching thin film transistor. Optionally, the connection bridge is on a side of an extension portion of the gate electrode of the driving thin film transistor away from the base substrate. Optionally, the connection bridge includes a first portion in direct contact with the extension portion of the gate electrode of the driving thin film transistor, a second portion in direct contact with the semiconductor electrode layer, and a third portion in direct contact with the active layer of the switching thin film transistor. Optionally, the third portion functions as the source electrode of the switching thin film transistor.

In some embodiments, the connection bridge is in a same layer as the source electrode and the drain electrode of the driving thin film transistor. Optionally, the connection bridge extends through the inter-layer dielectric layer respectively on two sides of the extension portion of the gate electrode of the driving thin film transistor to respectively connected to the two portions of the semiconductor electrode layer. Optionally, an orthographic projection of the connection bridge on the base substrate partially overlaps with an orthographic projection of the gate electrode of the driving thin film transistor on the base substrate In some embodiments, the pixel driving circuit further includes a detection switch thin film transistor. Optionally, a source electrode of the detection switch thin film transistor is connected to the drain electrode of the driving thin film transistor; a drain electrode of the detection switch thin film transistor is connected to the respective one of the plurality of detection and compensation lines; and a gate electrode of the detection switch thin film transistor is connected to a respective one of a plurality of second gate lines. Optionally, the second capacitor electrode, the source electrode of the detection switch thin film transistor, and the drain electrode of driving thin film transistor in the respective one of the plurality of pixel driving circuits are parts of a unitary structure. Optionally, the pixel driving circuit further includes a passivation layer between the second capacitor electrode and an anode of a light element in a respective one of the plurality of subpixels. Optionally, the anode of the light element in the respective one of the plurality of subpixels extends through the passivation layer to connect to the unitary structure.

In another aspect, the present invention provides a method of fabricating an array substrate. In some embodiments, the method includes forming an array of a plurality of subpixels comprising a plurality of columns of subpixels respectively spaced apart by a plurality of inter-subpixel regions; forming a plurality of pixel driving circuits respectively driving light emission of the plurality of subpixels; and forming a plurality of detection and compensation lead lines respectively configured to respectively detect signals in the plurality of subpixels and respectively compensate signals in the plurality of subpixels. Optionally, one of a plurality of detection and compensation lead lines electrically connects a respective one of the plurality of pixel driving circuits to a data detection and compensation circuit. Optionally, a respective one of the plurality of detection and compensation lead lines is disposed in a first inter-subpixel region between two directly adjacent columns of subpixels. Optionally, the respective one of the plurality of detection and compensation lead lines is spaced apart by at least one columns of subpixels from a signal line configured to transmit an alternating current and arranged along a direction parallel to the respective one of the plurality of detection and compensation lead lines.

In some embodiments, the method further includes forming a plurality of data lines configured to respectively transmit data signals to the plurality of subpixels. Optionally, the plurality of data lines and the plurality of detection and compensation lead lines are arranged along a substantially same direction. Optionally, the respective one of the plurality of detection and compensation lead lines is spaced apart by at least one columns of subpixels from any data line. Optionally, in at least a second inter-subpixel region of the plurality of inter-subpixel regions, two data lines of the plurality of data lines are formed in a same inter-subpixel region between two directly adjacent columns of subpixels.

In some embodiments, the method further includes forming a plurality of low voltage signal lines configured to provide a low voltage signal to a cathode of a light emitting element in a respective one of the plurality of subpixels. Optionally, the plurality of low voltage signal lines and the plurality of detection and compensation lead lines are formed along a substantially same direction. Optionally, a respective one of the plurality of low voltage signal lines and the respective one of the plurality of detection and compensation lead lines are formed in a same inter-subpixel region between two directly adjacent columns of subpixels.

In some embodiments, the method further includes forming a plurality of power supply lines configured to provide a high voltage signal to a respective one of the plurality of pixel driving circuit. Optionally, the plurality of power supply lines and the plurality of detection and compensation lead lines are formed along a substantially same direction. Optionally, a respective one of the plurality of power supply lines is formed in a third inter-subpixel region between two directly adjacent columns of subpixels; and the third subpixel region is spaced apart from the first subpixel region by at least one columns of subpixels. Optionally, N columns of the plurality of columns of subpixels, N number of data lines of a plurality of data lines, the respective one of the plurality of detection and compensation lead lines, and a respective one of a plurality of low voltage signal lines are formed between two most adjacent power supply lines of the plurality of power supply lines,N>2. Optionally, the respective one of the plurality of detection and compensation lead lines and the respective one of a plurality of low voltage signal lines are formed in a central-most inter-subpixel region between two adjacent central-most columns of the N columns of the plurality of columns of subpixels. Optionally, in at least a second inter-subpixel region of the plurality of inter-subpixel regions, two data lines of the plurality of data lines are formed in a same inter-subpixel region between two directly adjacent columns of subpixels.

In some embodiments, the method further includes forming a plurality of detection and compensation lines electrically connected to the plurality of detection and compensation lead lines. Optionally, a respective one of the plurality of detection and compensation lines electrically connects pixel driving circuits in a respective row of subpixels to a data detection and compensation circuit. Optionally, a respective one of the plurality of detection and compensation lines is formed in an inter-subpixel region between two directly adjacent rows of subpixels.

In some embodiments, forming a respective one of the plurality of pixel driving circuits includes forming a storage capacitor. Optionally, forming the storage capacitor includes forming a first capacitor and forming a second capacitor electrically connected in parallel. Optionally, forming the first capacitor includes forming a semiconductor electrode layer, a first capacitor electrode, and an insulating layer between the semiconductor electrode layer and the first capacitor electrode. Optionally, forming the second capacitor includes forming the semiconductor electrode layer, a second capacitor electrode, and an inter-layer dielectric layer between the semiconductor electrode layer and the second capacitor electrode. Optionally, the first capacitor electrode is configured to at least partially shield light irradiating on an active layer of a thin film transistor in the respective one of the plurality of pixel driving circuits. Optionally, an orthographic projection of the first capacitor electrode on a base substrate at least partially overlapping with an orthographic projection of the active layer of the thin film transistor in the respective one of the plurality of pixel driving circuits on the base substrate. Optionally, the second capacitor electrode is formed in a same layer as a source electrode of the thin film transistor in the respective one of the plurality of pixel driving circuits.

In some embodiments, forming the respective one of the plurality of pixel driving circuits further includes forming a driving thin film transistor and a switching thin film transistor. Optionally, a source electrode of the switching thin film transistor is connected to a respective one of a plurality of data lines; a drain electrode of the switching thin film transistor is connected to the semiconductor electrode layer; and a gate electrode of the switching thin film transistor is connected to a respective one of a plurality of first gate lines. Optionally, a source electrode of the driving thin film transistor is connected to a respective one of the plurality of power supply lines; a drain electrode of the driving thin film transistor is connected to a light emitting element in a respective one of the plurality of subpixels; and a gate electrode of the driving thin film transistor is connected to a drain electrode of the switching thin film transistor. Optionally, the semiconductor electrode layer and an active layer of the switching thin film transistor are formed as parts of a unitary structure. Optionally, forming the respective one of the plurality of pixel driving circuits includes forming a connection bridge electrically connecting the semiconductor electrode layer and the active layer of the switching thin film transistor. Optionally, the connection bridge is formed on a side of an extension portion of the gate electrode of the driving thin film transistor away from the base substrate. Optionally, the connection bridge is formed to include a first portion in direct contact with the extension portion of the gate electrode of the driving thin film transistor, a second portion in direct contact with the semiconductor electrode layer, and a third portion in direct contact with the active layer of the switching thin film transistor. Optionally, the third portion functions as the source electrode of the switching thin film transistor.

In some embodiments, the connection bridge is formed in a same layer as the source electrode and the drain electrode of the driving thin film transistor. Optionally, the connection bridge extends through the inter-layer dielectric layer respectively on two sides of the extension portion of the gate electrode of the driving thin film transistor to respectively connected to the two portions of the semiconductor electrode layer. Optionally, an orthographic projection of the connection bridge on the base substrate partially overlaps with an orthographic projection of the gate electrode of the driving thin film transistor on the base substrate In some embodiments, forming the respective one of the plurality of pixel driving circuits further includes forming a detection switch thin film transistor. Optionally, a source electrode of the detection switch thin film transistor is connected to the drain electrode of the driving thin film transistor; a drain electrode of the detection switch thin film transistor is connected to the respective one of the plurality of detection and compensation lines; and a gate electrode of the detection switch thin film transistor is connected to a respective one of a plurality of second gate lines. Optionally, the second capacitor electrode, the source electrode of the detection switch thin film transistor, and the drain electrode of driving thin film transistor in the respective one of the plurality of pixel driving circuits are formed as parts of a unitary structure. Optionally, the method further includes forming a passivation layer between the second capacitor electrode and an anode of a light element in a respective one of the plurality of subpixels. Optionally, the anode of the light element in the respective one of the plurality of subpixels extends through the passivation layer to connect to the unitary structure. Optionally, the respective one of the plurality of detection and compensation lines, a respective one of the plurality of first gate lines, and a respective one of the plurality of second gate lines are formed in a same inter-subpixel region between two directly adjacent rows of subpixels.

In some embodiments, the method further includes forming an auxiliary cathode on a base substrate and electrically connected to a respective one of the plurality of low voltage signal lines; forming at least a passivation layer on a side of the auxiliary cathode away from the base substrate; and forming a cathode of a light emitting element which extends through at least the passivation layer to connect to the auxiliary cathode.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate comprising:
    an array of a plurality of subpixels comprising a plurality of columns of subpixels respectively spaced apart by a plurality of inter-subpixel regions;
    a plurality of pixel driving circuits respectively driving light emission of the plurality of subpixels; and
    a plurality of detection and compensation lead lines respectively configured to respectively detect signals in the plurality of subpixels and respectively compensate signals in the plurality of subpixels;
    wherein one of a plurality of detection and compensation lead lines electrically connects a respective one of the plurality of pixel driving circuits to a data detection and compensation circuit;
    a respective one of the plurality of detection and compensation lead lines is disposed in a first inter-subpixel region between two directly adjacent columns of subpixels; and the respective one of the plurality of detection and compensation lead lines is spaced apart by at least one columns of subpixels from a signal line configured to transmit an alternating current and arranged along a direction parallel to the respective one of the plurality of detection and compensation lead lines.

2. The array substrate of claim 1, further comprising a plurality of data lines configured to respectively transmit data signals to the plurality of subpixels;
wherein the plurality of data lines and the plurality of detection and compensation lead lines are arranged along a substantially same direction; and
the respective one of the plurality of detection and compensation lead lines is spaced apart by at least one columns of subpixels from any data line.

3. The array substrate of claim 2, wherein, in at least a second inter-subpixel region of the plurality of inter-subpixel regions, two data lines of the plurality of data lines are in a same inter-subpixel region between two directly adjacent columns of sub pixels.

4. The array substrate of claim 1, further comprising a plurality of low voltage signal lines configured to provide a low voltage signal to a cathode of a light emitting element in a respective one of the plurality of subpixels;
wherein the plurality of low voltage signal lines and the plurality of detection and compensation lead lines are arranged along a substantially same direction; and
a respective one of the plurality of low voltage signal lines and the respective one of the plurality of detection and compensation lead lines are in a same inter-subpixel region between two directly adjacent columns of subpixels.

5. The array substrate of claim 1, further comprising a plurality of power supply lines configured to provide a high voltage signal to a respective one of the plurality of pixel driving circuit;
wherein the plurality of power supply lines and the plurality of detection and compensation lead lines are arranged along a substantially same direction;
a respective one of the plurality of power supply lines is disposed in a third inter-subpixel region between two directly adjacent columns of subpixels; and
the third inter-subpixel region is spaced apart from the first inter-subpixel region by at least one columns of subpixels.

6. The array substrate of claim 5, wherein N columns of the plurality of columns of subpixels, N number of data lines of a plurality of data lines, the respective one of the plurality of detection and compensation lead lines, and a respective one of a plurality of low voltage signal lines are disposed between two most adjacent power supply lines of the plurality of power supply lines, N >2.

7. The array substrate of claim 6, wherein the respective one of the plurality of detection and compensation lead lines and the respective one of the plurality of low voltage signal lines are disposed in a central-most inter-subpixel region between two adjacent central-most columns of the N columns of the plurality of columns of subpixels; and
in at least a second inter-subpixel region of the plurality of inter-subpixel regions, two data lines of the plurality of data lines are in a same inter-subpixel region between two directly adjacent columns of subpixels.

8. The array substrate of claim 1, further comprising a plurality of detection and compensation lines electrically connected to the plurality of detection and compensation lead lines;
wherein a respective one of the plurality of detection and compensation lines electrically connects pixel driving circuits in a respective row of subpixels to the data detection and compensation circuit; and
a respective one of the plurality of detection and compensation lines is disposed in an inter-subpixel region between two directly adjacent rows of subpixels.

9. The array substrate of claim 8, wherein a respective one of the plurality of pixel driving circuits comprises a storage capacitor;
the storage capacitor comprises a first capacitor and a second capacitor electrically connected in parallel;
the first capacitor comprises a semiconductor electrode layer, a first capacitor electrode, and an insulating layer between the semiconductor electrode layer and the first capacitor electrode; and
the second capacitor comprises the semiconductor electrode layer, a second capacitor electrode, and an interlayer dielectric layer between the semiconductor electrode layer and the second capacitor electrode;
wherein the first capacitor electrode is configured to at least partially shield light irradiating on an active layer of a thin film transistor in the respective one of the plurality of pixel driving circuits;
an orthographic projection of the first capacitor electrode on a base substrate at least partially overlapping with an orthographic projection of the active layer of the thin film transistor in the respective one of the plurality of pixel driving circuits on the base substrate; and
the second capacitor electrode is in a same layer as a source electrode of the thin film transistor in the respective one of the plurality of pixel driving circuits.

10. The array substrate of claim 9, wherein the respective one of the plurality of pixel driving circuits further comprises a driving thin film transistor and a switching thin film transistor;
a source electrode of the switching thin film transistor is connected to a respective one of a plurality of data lines;
a drain electrode of the switching thin film transistor is connected to the semiconductor electrode layer;
a gate electrode of the switching thin film transistor is connected to a respective one of a plurality of first gate lines;
a source electrode of the driving thin film transistor is connected to a respective one of a plurality of power supply lines;
a drain electrode of the driving thin film transistor is connected to a light emitting element in a respective one of the plurality of subpixels; and
a gate electrode of the driving thin film transistor is connected to a drain electrode of the switching thin film transistor;
wherein the semiconductor electrode layer and an active layer of the switching thin film transistor are parts of a unitary structure;
the respective one of the plurality of pixel driving circuits comprises a connection bridge electrically connecting the semiconductor electrode layer and the active layer of the switching thin film transistor;
the connection bridge is on a side of an extension portion of the gate electrode of the driving thin film transistor away from the base substrate;
the connection bridge comprises a first portion in direct contact with the extension portion of the gate electrode of the driving thin film transistor, a second portion in direct contact with the semiconductor electrode layer, and a third portion in direct contact with the active layer of the switching thin film transistor; and the third portion functions as the source electrode of the switching thin film transistor.

11. The array substrate of claim 10, wherein the connection bridge is in a same layer as the source electrode and the drain electrode of the driving thin film transistor;

the connection bridge extends through the inter-layer dielectric layer respectively on two sides of the extension portion of the gate electrode of the driving thin film transistor to respectively connected to two portions of the semiconductor electrode layer; and an orthographic projection of the connection bridge on the base substrate partially overlaps with an orthographic projection of the gate electrode of the driving thin film transistor on the base substrate.

12. The array substrate of claim 10, wherein the respective one of the plurality of pixel driving circuits further comprises a detection switch thin film transistor;

a source electrode of the detection switch thin film transistor is connected to the drain electrode of the driving thin film transistor;

a drain electrode of the detection switch thin film transistor is connected to the respective one of the plurality of detection and compensation lines;

a gate electrode of the detection switch thin film transistor is connected to a respective one of a plurality of second gate lines;

the second capacitor electrode, the source electrode of the detection switch thin film transistor, and the drain electrode of driving thin film transistor in the respective one of the plurality of pixel driving circuits are parts of a unitary structure;

the array substrate further comprises a passivation layer between the second capacitor electrode and an anode of a light element in a respective one of the plurality of subpixels; and the anode of the light element in the respective one of the plurality of subpixels extends through the passivation layer to connect to the unitary structure.

13. The array substrate of claim 12, wherein the respective one of the plurality of detection and compensation lines, a respective one of the plurality of first gate lines, and a respective one of the plurality of second gate lines are disposed in a same inter-subpixel region between two directly adjacent rows of subpixels.

14. The array substrate of claim 4, further comprising:

an auxiliary cathode on a base substrate and electrically connected to a respective one of the plurality of low voltage signal lines;

at least a passivation layer on a side of the auxiliary cathode away from the base substrate;

wherein a cathode of a light emitting element extends through at least the passivation layer to connect to the auxiliary cathode.

15. A display apparatus, comprising the array substrate of claim 1, and one or more integrated circuits connected to the array substrate.

16. A pixel driving circuit, comprising a storage capacitor;

wherein the storage capacitor comprises a first capacitor and a second capacitor electrically connected in parallel;

the first capacitor comprises a semiconductor electrode layer, a first capacitor electrode, and an insulating layer between the semiconductor electrode layer and the first capacitor electrode; and the second capacitor comprises the semiconductor electrode layer, a second capacitor electrode, and an inter-layer dielectric layer between the semiconductor electrode layer and the second capacitor electrode;

wherein the first capacitor electrode is configured to at least partially shield light irradiating on an active layer of a thin film transistor in the respective one of a plurality of pixel driving circuits;

an orthographic projection of the first capacitor electrode on a base substrate at least partially overlapping with an orthographic projection of the active layer of the thin film transistor in the respective one of the plurality of pixel driving circuits on the base substrate; and the second capacitor electrode is in a same layer as a source electrode of the thin film transistor in the respective one of the plurality of pixel driving circuits wherein the pixel driving circuit further comprises a driving thin film transistor and a switching thin film transistor;

a source electrode of the switching thin film transistor is connected to a respective one of a plurality of data lines;

a drain electrode of the switching thin film transistor is connected to the semiconductor electrode layer;

a gate electrode of the switching thin film transistor is connected to a respective one of a plurality of first gate lines;

a source electrode of the driving thin film transistor is connected to a respective one of a plurality of power supply lines;

a drain electrode of the driving thin film transistor is connected to a light emitting element in a respective one of a plurality of subpixels; and a gate electrode of the driving thin film transistor is connected to a drain electrode of the switching thin film transistor;

wherein the semiconductor electrode layer and an active layer of the switching thin film transistor are parts of a unitary structure;

the respective one of the plurality of pixel driving circuits comprises a connection bridge electrically connecting the semiconductor electrode layer and the active layer of the switching thin film transistor;

the connection bridge is on a side of an extension portion of the gate electrode of the driving thin film transistor away from the base substrate;

the connection bridge comprises a first portion in direct contact with the extension portion of the gate electrode of the driving thin film transistor, a second portion in direct contact with the semiconductor electrode layer, and a third portion in direct contact with the active layer of the switching thin film transistor; and the third portion functions as the source electrode of the switching thin film transistor.

17. The pixel driving circuits of claim 16, wherein the connection bridge is in a same layer as the source electrode and the drain electrode of the driving thin film transistor;

the connection bridge extends through the inter-layer dielectric layer respectively on two sides of the extension portion of the gate electrode of the driving thin film transistor to respectively connected to two portions of the semiconductor electrode layer; and an orthographic projection of the connection bridge on the base substrate partially overlaps with an orthographic projection of the gate electrode of the driving thin film transistor on the base substrate.

18. The pixel driving circuits of claim 16, further comprising a detection switch thin film transistor;
- a source electrode of the detection switch thin film transistor is connected to the drain electrode of the driving thin film transistor;
- a drain electrode of the detection switch thin film transistor is connected to the respective one of a plurality of detection and compensation lines;
- a gate electrode of the detection switch thin film transistor is connected to a respective one of a plurality of second gate lines;
- the second capacitor electrode, the source electrode of the detection switch thin film transistor, and the drain electrode of driving thin film transistor in the respective one of the plurality of pixel driving circuits are parts of a unitary structure;
- the pixel driving circuits further comprises a passivation layer between the second capacitor electrode and an anode of a light element in a respective one of the plurality of subpixels; and
- the anode of the light element in the respective one of the plurality of subpixels extends through the passivation layer to connect to the unitary structure.

19. A method of fabricating an array substrate, comprising:
- forming an array of a plurality of subpixels comprising a plurality of columns of subpixels respectively spaced apart by a plurality of inter-subpixel regions;
- forming a plurality of pixel driving circuits respectively driving light emission of the plurality of subpixels; and
- forming a plurality of detection and compensation lead lines respectively configured to respectively detect signals in the plurality of subpixels and respectively compensate signals in the plurality of subpixels;
- wherein one of the plurality of detection and compensation lead lines electrically connects a respective one of the plurality of pixel driving circuits to a data detection and compensation circuit;
- a respective one of the plurality of detection and compensation lead lines is disposed in a first inter-subpixel region between two directly adjacent columns of subpixels; and
- the respective one of the plurality of detection and compensation lead lines is spaced apart by at least one columns of subpixels from a signal line configured to transmit an alternating current and arranged along a direction parallel to the respective one of the plurality of detection and compensation lead lines.

* * * * *